United States Patent
Wu et al.

(10) Patent No.: US 11,923,359 B2
(45) Date of Patent: Mar. 5, 2024

(54) METHOD FOR FORMING FIN FIELD EFFECT TRANSISTOR (FINFET) DEVICE STRUCTURE

(71) Applicant: TAIWAN SEMICONDUCTOR MANUFACTURING COMPANY, LTD., Hsinchu (TW)

(72) Inventors: Chung-Shu Wu, Taoyuan (TW); Shu-Uei Jang, Hsinchu (TW); Wei-Yeh Tang, Taoyuan (TW); Ryan Chia-Jen Chen, Hsinchu (TW); An-Chyi Wei, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 162 days.

(21) Appl. No.: 17/373,022

(22) Filed: Jul. 12, 2021

(65) Prior Publication Data

US 2021/0343711 A1    Nov. 4, 2021

Related U.S. Application Data

(60) Continuation of application No. 16/712,162, filed on Dec. 12, 2019, now Pat. No. 11,063,043, which is a division of application No. 15/669,013, filed on Aug. 4, 2017, now Pat. No. 10,515,952.

(51) Int. Cl.
*H01L 27/088*    (2006.01)
*H01L 21/311*    (2006.01)
*H01L 21/768*    (2006.01)
*H01L 21/8234*    (2006.01)
*H01L 29/161*    (2006.01)

(52) U.S. Cl.
CPC ..... *H01L 27/0886* (2013.01); *H01L 21/31116* (2013.01); *H01L 21/76865* (2013.01); *H01L 21/823431* (2013.01); *H01L 21/823468* (2013.01); *H01L 21/823481* (2013.01); *H01L 29/161* (2013.01); *H01L 21/823412* (2013.01)

(58) Field of Classification Search
CPC .......... H01L 27/0886; H01L 21/31116; H01L 21/76865; H01L 21/823431; H01L 21/823468; H01L 21/823481; H01L 29/161; H01L 21/823412
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |

(Continued)

*Primary Examiner* — Bitew A Dinke
(74) *Attorney, Agent, or Firm* — Birch, Stewart, Kolasch & Birch, LLP

(57) ABSTRACT

A method for forming a FinFET device structure is provided. The method includes forming a first fin structure and a second fin structure over a substrate and forming a liner layer over the first fin structure and the second fin structure. The method also includes forming an isolation layer over the liner layer and removing a portion of the liner layer and a portion of the isolation layer, such that the liner layer includes a first liner layer on an outer sidewall surface of the first fin structure and a second liner layer on an inner sidewall surface of the first fin structure, and a top surface of the second liner layer is higher than a top surface of the first liner layer.

20 Claims, 18 Drawing Sheets

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,385,189 B1 | 7/2016 | Sung et al. |
| 9,401,302 B2 | 7/2016 | Tsai et al. |
| 9,455,204 B1 | 9/2016 | Cao et al. |
| 9,520,482 B1 | 12/2016 | Chang et al. |
| 9,548,303 B2 | 1/2017 | Lee et al. |
| 9,552,978 B1 | 1/2017 | Huang et al. |
| 9,576,814 B2 | 2/2017 | Wu et al. |
| 9,679,819 B1 | 6/2017 | Tung |
| 9,754,798 B1 | 9/2017 | Bi et al. |
| 9,991,262 B1 | 6/2018 | Ching et al. |
| 10,276,449 B1 | 4/2019 | Wu et al. |
| 10,515,952 B2* | 12/2019 | Wu ............... H01L 21/823431 |
| 2011/0147848 A1 | 6/2011 | Kuhn et al. |
| 2014/0065802 A1 | 3/2014 | Chang et al. |
| 2014/0191324 A1 | 7/2014 | Cai et al. |
| 2014/0231919 A1 | 8/2014 | Peng et al. |
| 2014/0374828 A1* | 12/2014 | Song ............... H01L 27/0886 257/401 |
| 2014/0374838 A1 | 12/2014 | Chen et al. |
| 2015/0102386 A1* | 4/2015 | Chen ............... H01L 29/7853 438/424 |
| 2015/0145068 A1 | 5/2015 | Chen et al. |
| 2015/0187944 A1* | 7/2015 | Ching ............... H01L 21/0262 257/190 |
| 2015/0200297 A1 | 7/2015 | Lee et al. |
| 2015/0243739 A1 | 8/2015 | Chen et al. |
| 2015/0263003 A1* | 9/2015 | Lee ............... H01L 21/823821 438/424 |
| 2015/0270401 A1* | 9/2015 | Huang ............... H01L 29/7848 257/192 |
| 2015/0340302 A1* | 11/2015 | Chen ............... H01L 23/3171 257/190 |
| 2015/0357443 A1 | 12/2015 | Ching et al. |
| 2015/0380316 A1 | 12/2015 | Yu et al. |
| 2016/0035827 A1 | 2/2016 | Diaz et al. |
| 2016/0049335 A1 | 2/2016 | Liu et al. |
| 2016/0071932 A1* | 3/2016 | Sung ............... H01L 21/823821 257/369 |
| 2016/0126142 A1* | 5/2016 | Chen ............... H01L 21/28035 438/585 |
| 2016/0141205 A1* | 5/2016 | Chiang ............... H01L 27/0886 438/424 |
| 2016/0163700 A1* | 6/2016 | Peng ............... H01L 21/845 257/401 |
| 2016/0190303 A1 | 6/2016 | Liu et al. |
| 2016/0225764 A1* | 8/2016 | Chang ............... H01L 29/495 |
| 2016/0247876 A1* | 8/2016 | Chung ............... H01L 21/823431 |
| 2016/0276482 A1* | 9/2016 | Kim ............... H01L 27/0924 |
| 2016/0293598 A1 | 10/2016 | Kim et al. |
| 2016/0315146 A1* | 10/2016 | Jung ............... H01L 21/823431 |
| 2016/0315193 A1* | 10/2016 | Kim ............... H01L 27/0886 |
| 2016/0329321 A1 | 11/2016 | Shi et al. |
| 2016/0351565 A1 | 12/2016 | Sung et al. |
| 2016/0379982 A1* | 12/2016 | You ............... H01L 29/7854 257/369 |
| 2017/0005014 A1 | 1/2017 | Yamashita et al. |
| 2017/0062613 A1 | 3/2017 | Sung et al. |
| 2017/0069539 A1 | 3/2017 | Li et al. |
| 2017/0069549 A1 | 3/2017 | Basker et al. |
| 2017/0069630 A1* | 3/2017 | Cha ............... H01L 27/0922 |
| 2017/0092728 A1 | 3/2017 | Kim et al. |
| 2017/0103985 A1 | 4/2017 | Kim et al. |
| 2017/0110454 A1* | 4/2017 | Chang ............... H01L 29/495 |
| 2017/0125597 A1* | 5/2017 | Kim ............... H01L 29/7855 |
| 2017/0148877 A1 | 5/2017 | Jung et al. |
| 2017/0162670 A1 | 8/2017 | You et al. |
| 2017/0222020 A1* | 8/2017 | Yu ............... H01L 27/0886 |
| 2017/0229542 A1 | 8/2017 | Balakrishnan et al. |
| 2017/0236717 A1 | 8/2017 | Briggs et al. |
| 2017/0256645 A1 | 9/2017 | Chung et al. |
| 2017/0330742 A1 | 11/2017 | Ting et al. |
| 2018/0005841 A1 | 1/2018 | Farmer et al. |
| 2018/0090367 A1 | 3/2018 | Bi et al. |
| 2018/0090385 A1 | 3/2018 | Bi et al. |
| 2018/0090606 A1* | 3/2018 | Bu ............... H01L 21/823431 |
| 2018/0102429 A1* | 4/2018 | Kim ............... H01L 29/785 |
| 2018/0130802 A1 | 5/2018 | Wang et al. |
| 2018/0175200 A1 | 6/2018 | Lee et al. |
| 2018/0190821 A1* | 7/2018 | Kim ............... H01L 29/7843 |
| 2018/0315664 A1* | 11/2018 | Cheng ............... H01L 29/1054 |
| 2018/0366465 A1 | 12/2018 | Ching et al. |
| 2019/0043858 A1* | 2/2019 | Lin ............... H01L 21/823481 |
| 2020/0105583 A1 | 4/2020 | Wang et al. |

* cited by examiner

METHOD FOR FORMING FIN FIELD EFFECT TRANSISTOR (FINFET) DEVICE STRUCTURE

CROSS REFERENCE TO RELATED APPLICATIONS

This application is a Continuation application of U.S. patent application Ser. No. 16/712,162, filed on Dec. 12, 2019, which is a Divisional application of U.S. patent application Ser. No. 15/669,013, filed on Aug. 4, 2017, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nano-meter technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin.

The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
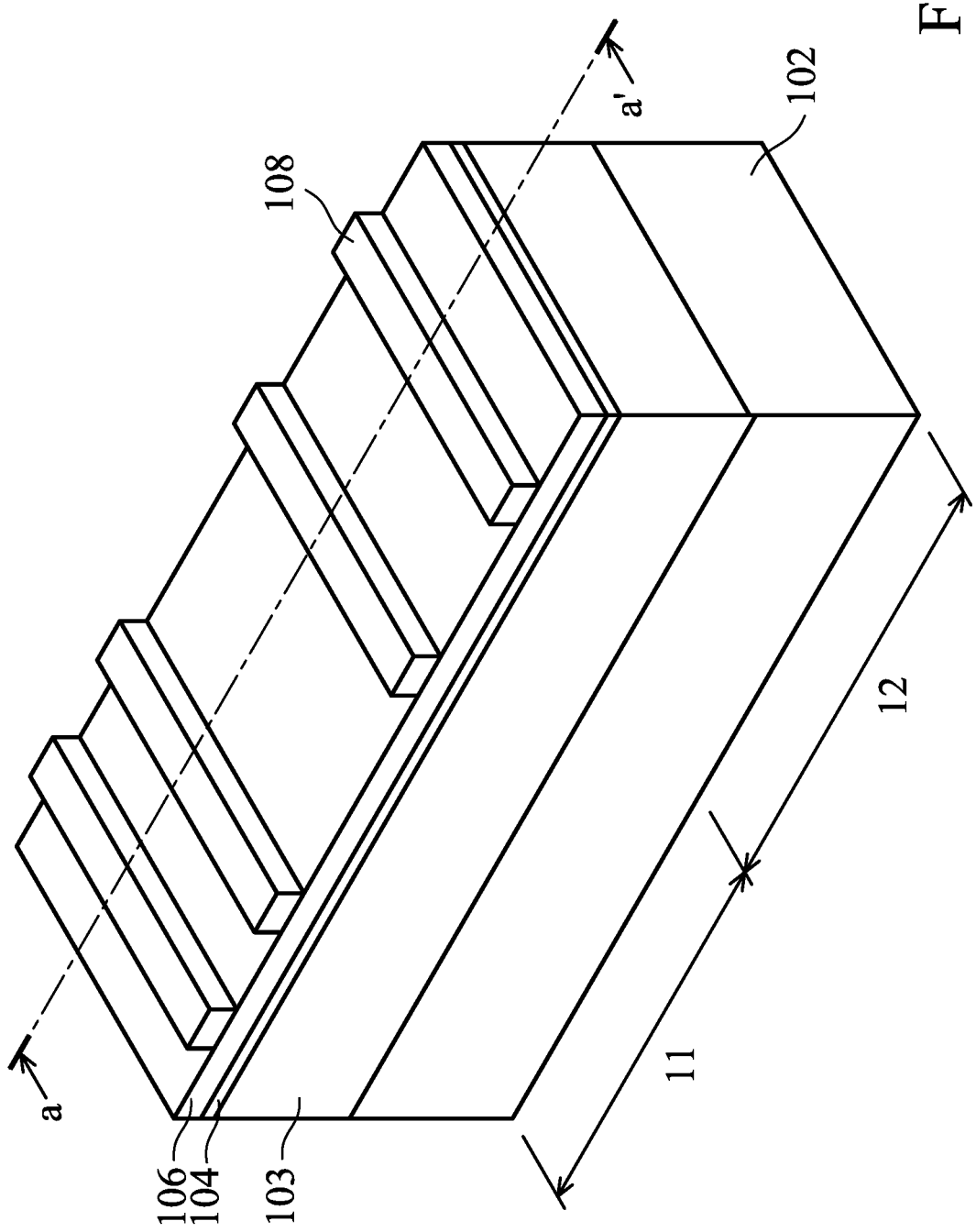
FIGS. 1A-1I show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments for forming a fin field effect transistor (FinFET) device structure are provided. FIGS. 1A-1I show perspective representations of various stages of forming a FinFET device structure 100, in accordance with some embodiments of the disclosure.

Referring to FIG. 1A, a substrate 102 is provided. The substrate 102 includes a first region 11 and a second region 12. The substrate 102 may be made of silicon or other semiconductor materials. In some embodiments, the substrate 102 is a silicon wafer. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A material layer 103 is formed over the substrate 102. The material layer 103 and the substrate 102 are made of different materials. In some embodiments, the material layer 103 is made of silicon germanium (SiGe). The material layer 103 is formed by an epitaxial process. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, or other suitable epi processes.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 1B:
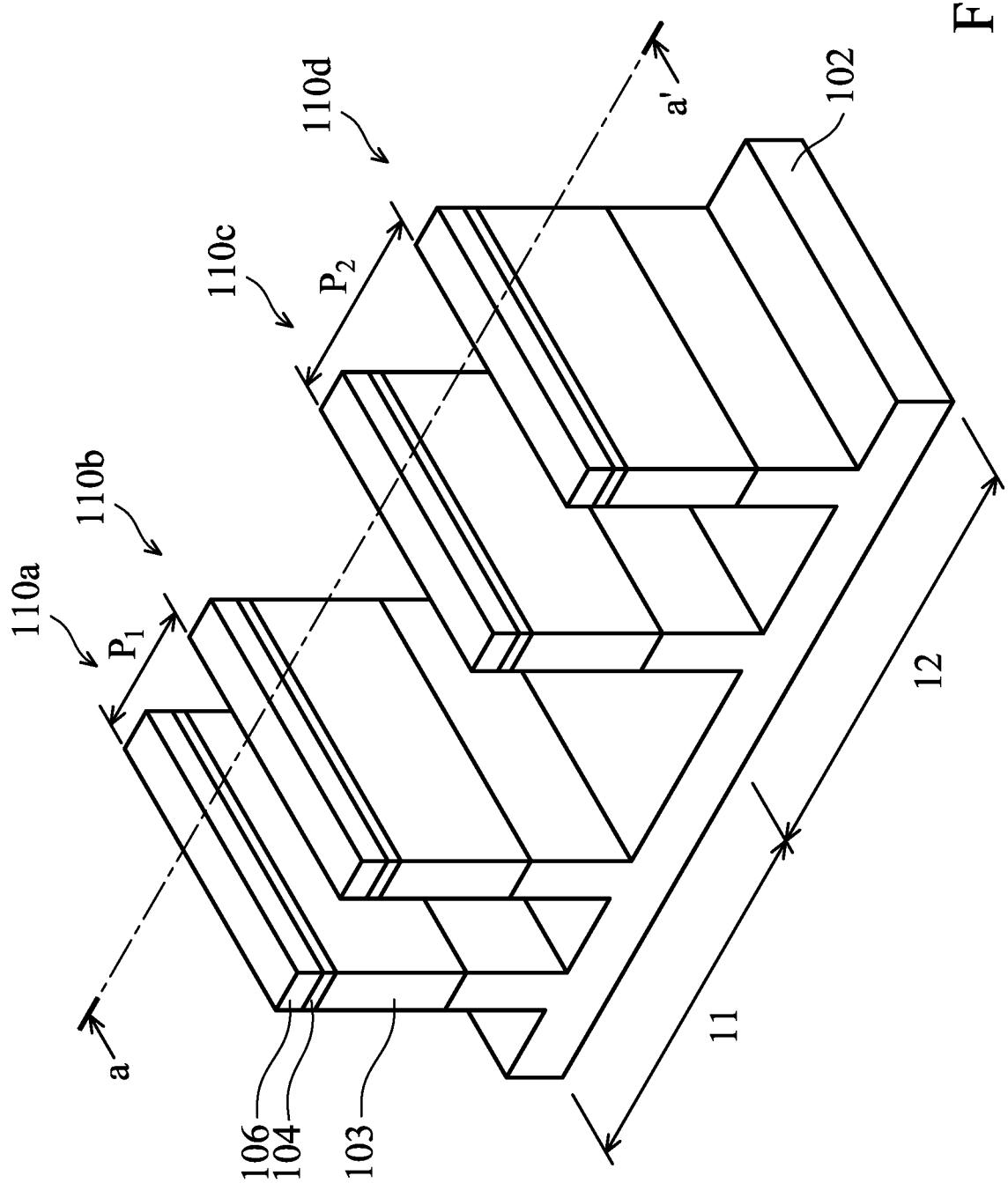

Afterwards, as shown in FIG. 1B, after the photoresist layer 108 is patterned, the dielectric layer 104 and the mask layer 106 are patterned by using the patterned photoresist layer 108 as a mask, in accordance with some embodiments. As a result, a patterned dielectric layer 104 and a patterned mask layer 106 are obtained. Afterwards, the patterned photoresist layer 108 is removed.

Afterwards, an etching process is performed on the material layer 103 and the substrate 102 to form a number of fin structures 110a, 110b, 110c and 110d by using the patterned dielectric layer 104 and the patterned mask layer 106 as a mask. The first fin structure 110a and the second fin structure 110b are formed in the first region 11. The third fin structure 110c and the fourth fin structure 110d are formed in the second region 12. A first pitch $P_1$ is between a sidewall surface of the first fin structure 110a and a sidewall surface of the second fin structure 110b. A second pitch $P_2$ is between a sidewall surface of the third fin structure 110c and a sidewall surface of the fourth fin structure 110d. In some embodiments, the second pitch $P_2$ is greater than the first pitch $P_1$. In some embodiments, the first pitch $P_1$ is in a range from about 10 nm to about 40 nm. In some embodiments, the second pitch P2 is in a range from about 20 nm to about 50 nm.

Each of the fin structures 110a, 110b, 110c and 110d has a top portion and a bottom portion. In some embodiments, the top portion of each of fin structures 110a, 110b, 110c and 110d is made of silicon germanium (SiGe), and the bottom portion is made of silicon (Si). The silicon germanium (SiGe) below a gate structure is used as a channel region. The silicon germanium (SiGe) having compressive stress is suitable for providing increased carrier speed, i.e., increased hole carrier speed, for the channel region of P-type FinFET (PMOS device).

In some embodiments, each of the fin structures 110a, 110b, 110c and 110d has a width that gradually increases from the top portion to the bottom portion. In other words, each of the fin structures 110a, 110b has a tapered fin width which is gradually tapered from the bottom portion to the top portion.

The etching process may be a dry etching process or a wet etching process. In some embodiments, the substrate 102 is etched using a dry etching process. The dry etching process includes using a fluorine-based etchant gas, such as $SF_6$, $C_xF_y$, $NF_3$, or a combination thereof. The etching process may be a time-controlled process, and continue until the fin structures 110a, 110b reach a predetermined height.

Figure 1C:
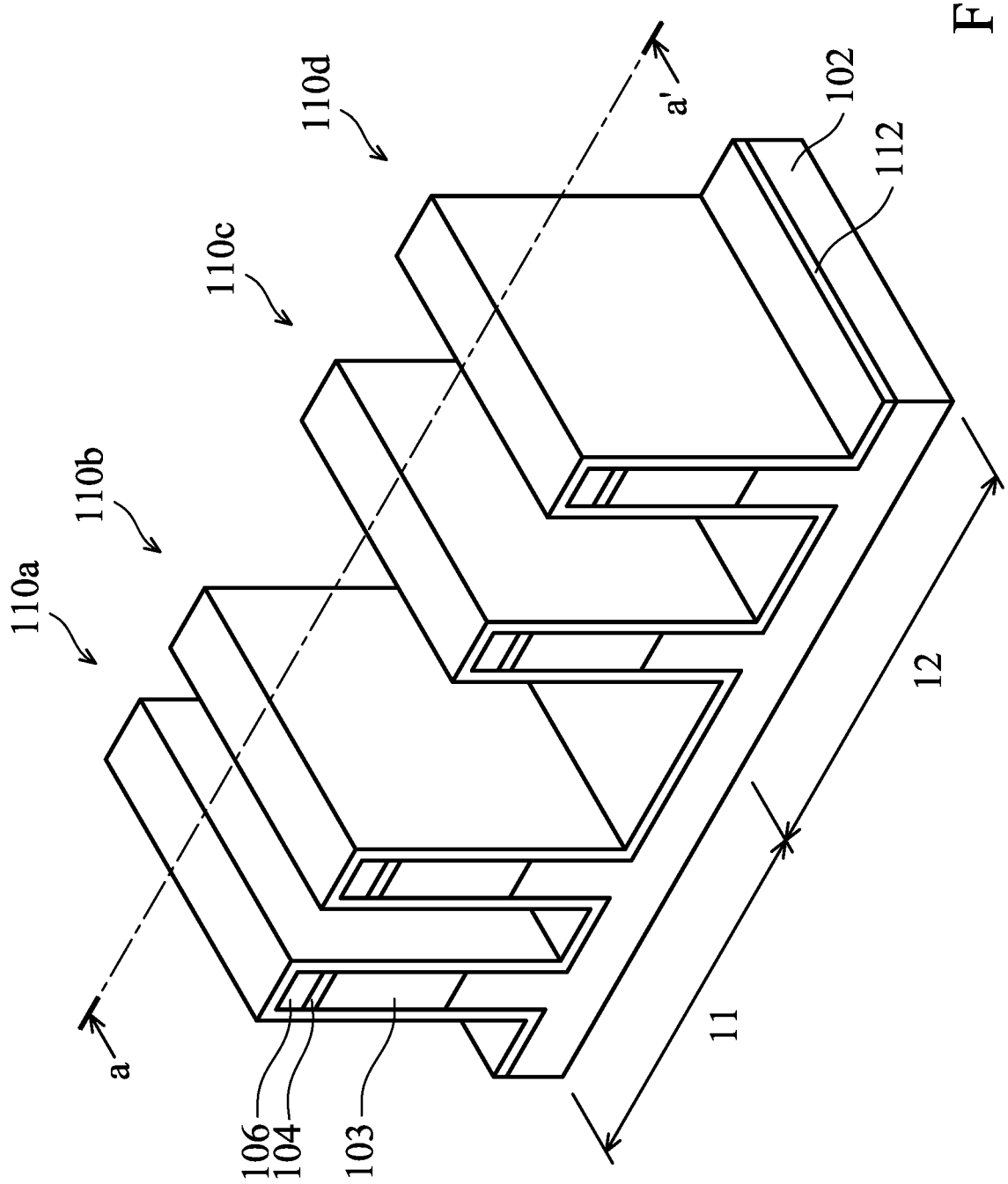

As shown in FIG. 1C, after the fin structures 110a, 110b, 110c and 110d are formed, a liner layer 112 is formed on the fin structures 110a, 110b, 110c and 110d. More specifically, the liner layer 112 is conformally formed on the sidewall surfaces, top surface of the fin structures 110a, 110b, 110c and 110d, and on the mask layer 106.

The liner layer 112 is used to protect the fin structures 110a, 110b, 110c and 110d from being damaged by the following processes (such as an anneal process or an etching process). Therefore, the profiles or shapes of the fin structures 110a, 110b, 110c and 110d are maintained or preserved by the protection of the liner layer 112.

In some embodiments, the liner layer 112 is made of silicon nitride (SixNy). In some embodiments, the liner layer 112 is not made of oxide, such as silicon oxide. If the liner layer 112 made of silicon oxide, the liner layer 112 is not robust enough to protect the fin structures 110a, 110b, 110c and 110d, especially when the fin structures 110a, 110b, 110c and 110d include silicon germanium (SiGe). When the material layer 103 is made of silicon germanium (SiGe), silicon germanium (SiGe) is easily oxidized to form germanium oxide (GeOx) during the subsequent annealing process. Once the germanium oxide (GeOx) is formed, it is easily removed by the etching process. Therefore, the profiles or shape of the fin structures 110a, 110b, 110c and 110d will be changed. In addition, the germanium (Ge) concentration will be reduced due to the oxidation reaction.

Figure 1D:
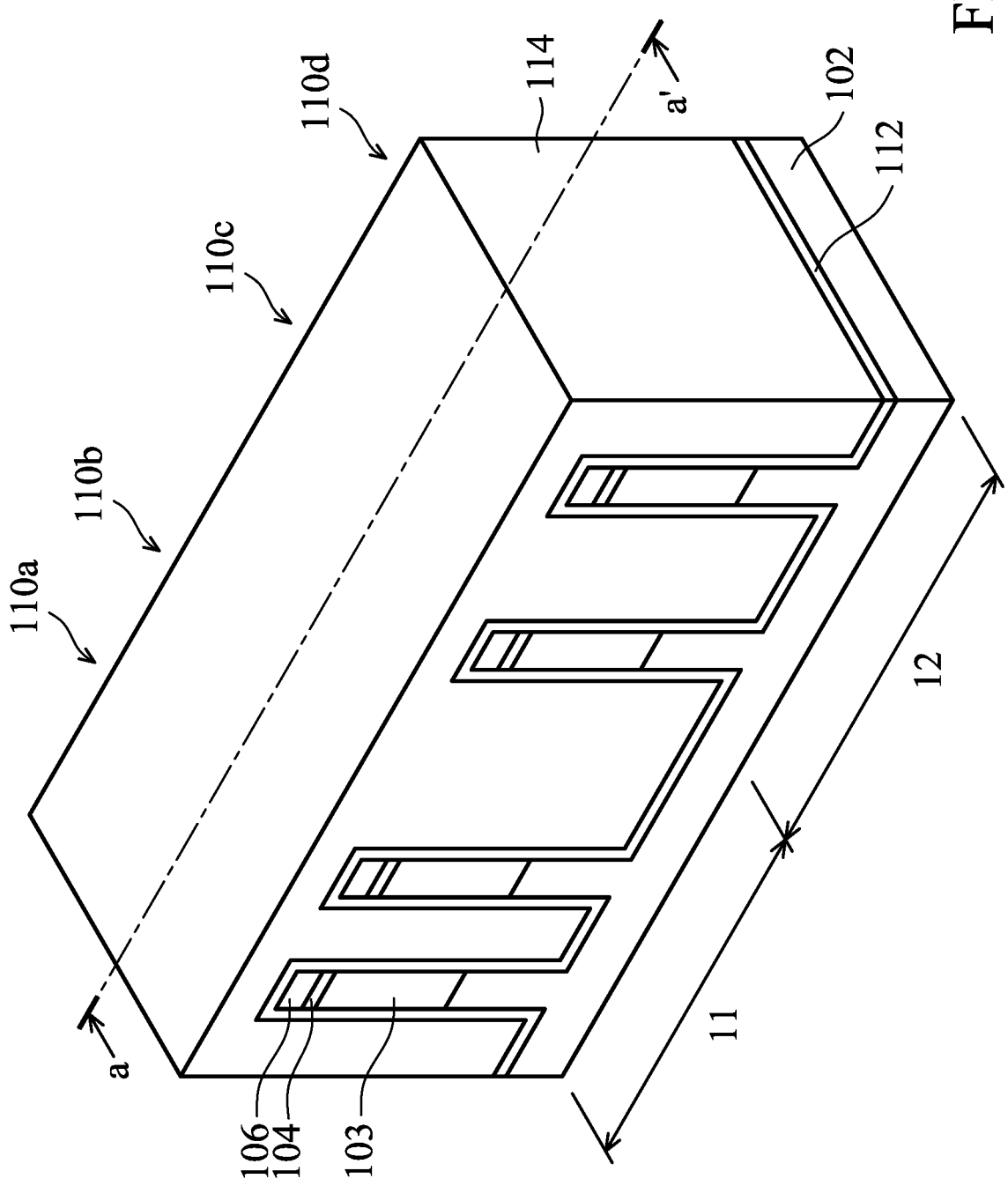

Afterwards, as shown in FIG. 1D, an isolation layer 114 is formed to cover the fin structures 110a, 110b, 110c and 110d over the substrate 102, in accordance with some embodiments.

In some embodiments, the isolation layer 114 is made of silicon oxide, silicon nitride, silicon oxynitride, fluoride-doped silicate glass (FSG), or another low-k dielectric material. The isolation layer 114 may be deposited by a deposition process, such as a chemical vapor deposition (CVD) process, a spin-on-glass process, or another applicable process.

In some embodiments, the isolation layer 114 is formed by a flowable chemical vapor deposition (FCVD) process. The isolation layer 114 is solidified by a UV curing process. Afterwards, an annealing process is performed on the isolation layer 114 to improve the quality of the isolation layer 114. In some embodiments, the annealing process is performed at a temperature in a range from about 400 degrees to about 700 degrees. The patterned mask layer 106 and the liner layer 112 both are used to protect the material layer 103 from being damaged during the annealing process, and therefore the profiles of the top portion of the fin structures 110a, 110b, 110c and 110d are not damaged by the high temperature.

Figure 1E:
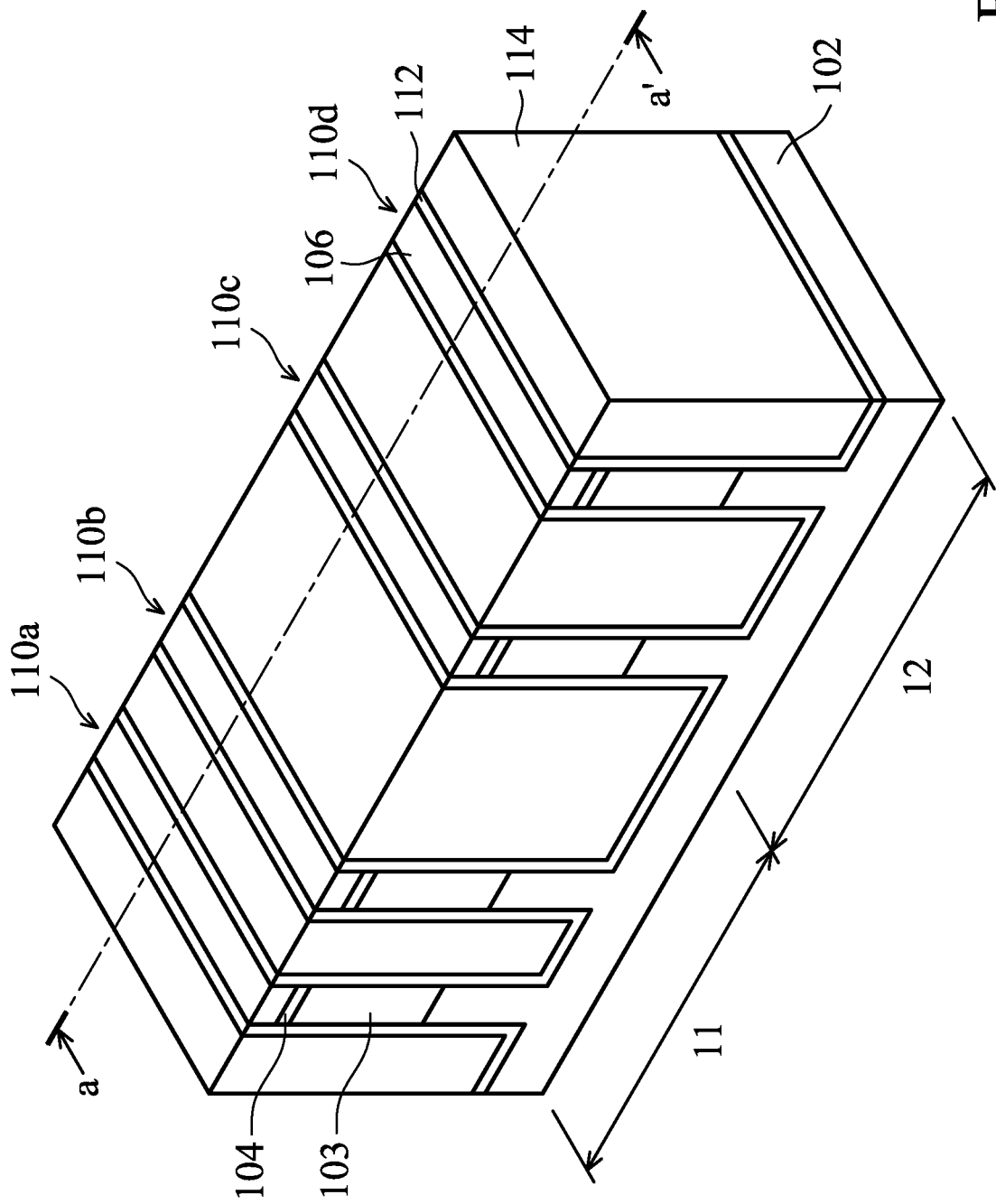

Next, as shown in FIG. 1E, the isolation layer 114 is thinned or planarized to expose the top surface of the patterned mask layer 106, in accordance with some embodiments. In some embodiments, the isolation layer 114 is thinned by a chemical mechanical polishing (CMP) process.

Figure 1F:
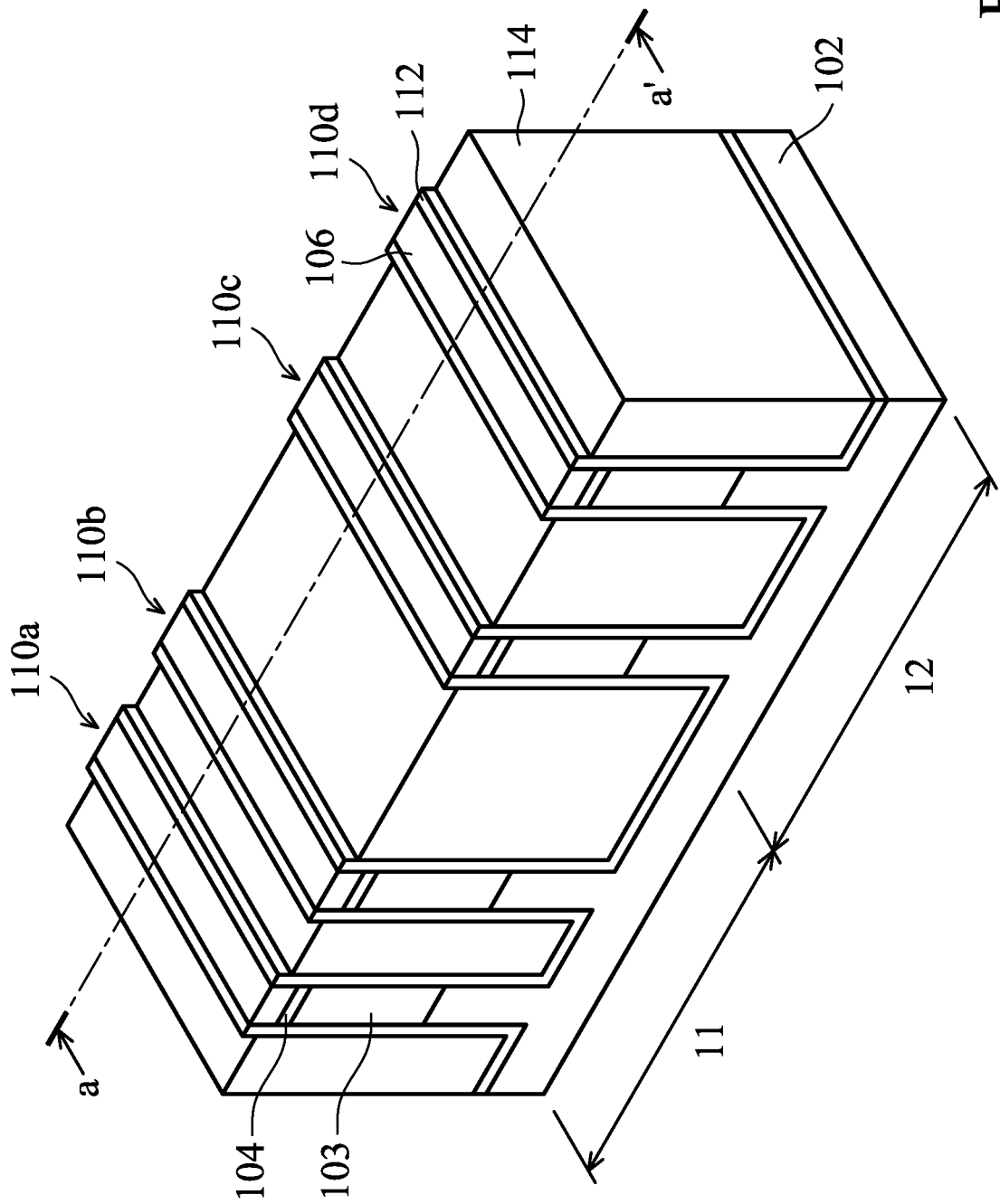

Afterwards, as shown in FIG. 1F, a portion of the isolation layer 114 is removed, in accordance with some embodiments. As a result, a top surface of the patterned mask layer 106 is exposed, and a portion of the liner layer 112 is exposed.

Figure 1G:
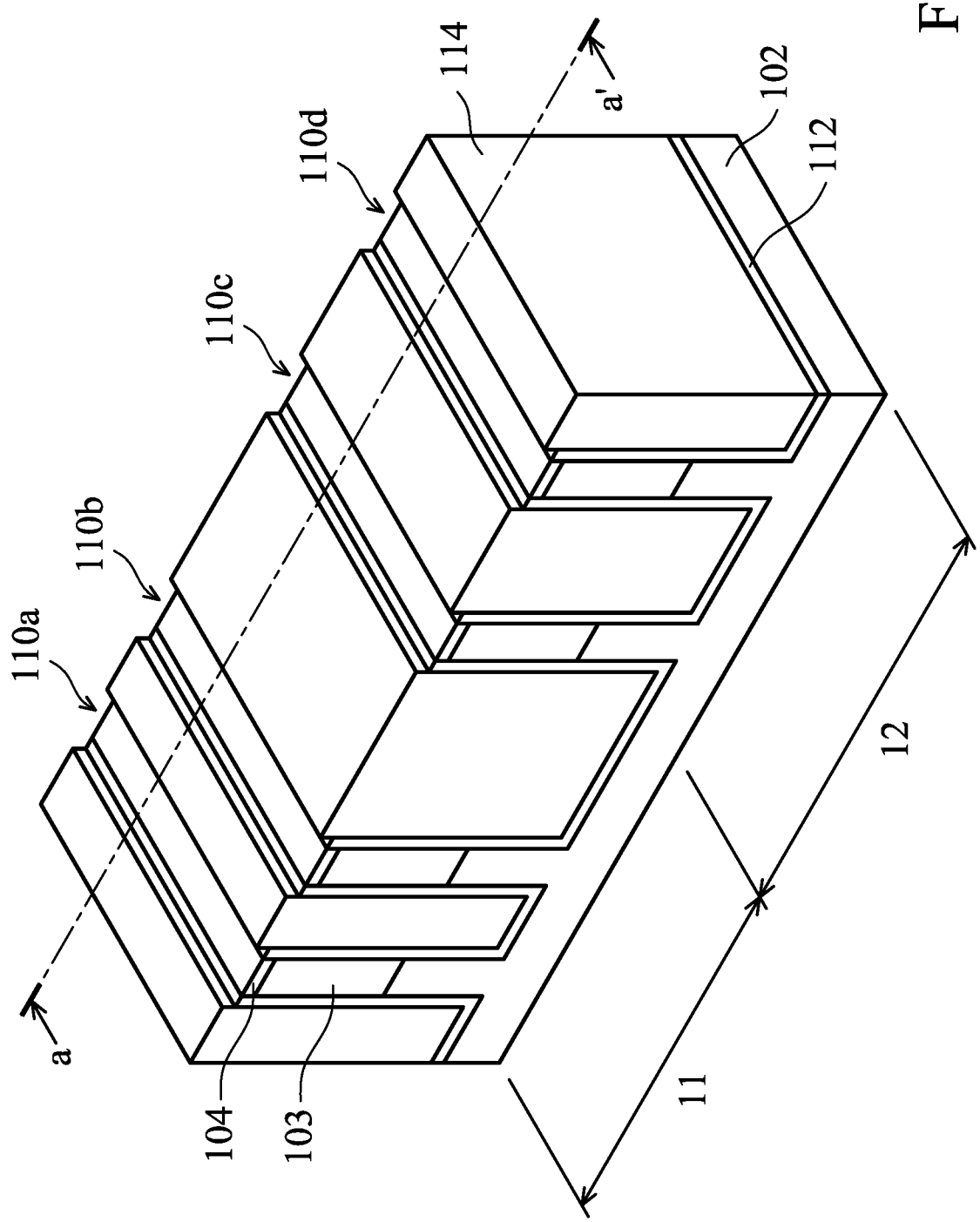

Next, as shown in FIG. 1G, the patterned mask layer 106 is removed, in accordance with some embodiments. In some embodiments, the patterned mask layer 106 is removed by a wet etching process. In some embodiments, the wet etching process includes using a phosphoric acid ($H_3PO_4$) etching solution.

Figure 1H:
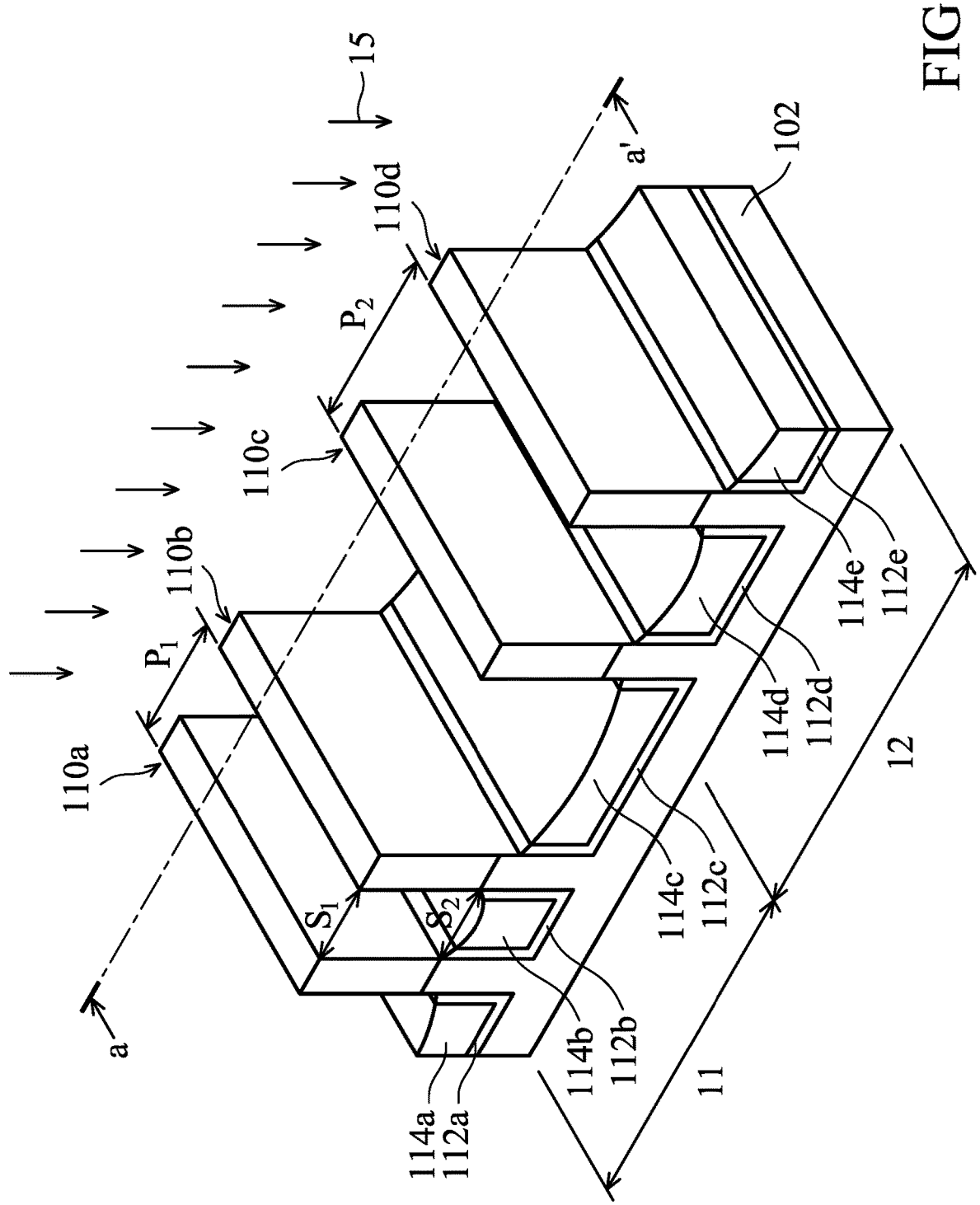

Afterwards, as shown in FIG. 1H, an etching process 15 is performed on the patterned dielectric layer 104, the liner layer 112 and the isolation layer 114, in accordance with some embodiments. The etching process 15 is used to remove a portion of the liner layer 112 and a portion of the isolation layer 114. As a result, a first liner layer 112a, a second liner layer 112b, a third liner layer 112c, a fourth liner layer 112d and a fifth liner layer 112e are obtained. In addition, a first isolation structure 114a, a second isolation structure 114b, a third isolation structure 114c, a fourth isolation structure 114d and a fifth isolation structure 114e are obtained.

The first fin structure 110a has the inner sidewall surface and the outer sidewall surface. The inner sidewall surface of the first fin structure 110a is close to the second fin structure 110b and the outer sidewall surface away from the second fin structure 110b. The first liner layer 112a is formed on the outer sidewall surface of the first fin structure 110a, and the second liner layer 112b is formed on the inner sidewall surface of the first fin structure 110a. Note that the top surface of the second liner layer 112b is higher than the top surface of the first liner layer 112a. In some embodiments, the height difference between the top surface of the second liner layer 112b and the top surface of the first liner layer 112a is in a range from about 0.1 nm to about 2 nm.

The second liner layer 112b is extended from the inner sidewall surface of the first fin structure 110a to the inner sidewall surface of the second fin structure 110b. The third liner layer 112c is formed on outer sidewall surface of the second fin structure 110b. Note that the top surface of the second liner layer 112b is higher than the top surface of the third liner layer 112c.

In addition, the third liner layer 112c is extended from the outer sidewall surface of the second fin structure 110b to the outer sidewall surface of the third fin structure 110c. The fourth liner layer 112d is formed on the inner sidewall surface of the third fin structure 110c and on the inner sidewall surface of the fourth fin structure 110d. The fifth liner layer 112e is formed on outer sidewall surface of the fourth fin structure 110d. Note that the top surface of the fourth liner structure 112d is higher than the top surface of the third liner layer 112c and the top surface of the fifth liner layer 112e. Furthermore, the top surface of the fourth liner layer 112d is lower than the top surface of the second liner layer 112b. In other words, the top surface of the second liner layer 112b is higher than the top surface of the fourth liner layer 112d.

The interface between the top portion and the bottom portion of the first fin structure 110a is higher than the top surface of the first liner layer 112a and the top surface of the second liner layer 112b. Similarly, the interface between the top portion and the bottom portion of the second fin structure 110b is higher than the top surface of the second liner layer 112b and the top surface of the third liner layer 112c. The interface between the top portion and the bottom portion of the third fin structure 110c is higher than the top surface of the fourth liner layer 112d. The interface between the top portion and the bottom portion of the fourth fin structure 110d is higher than the top surface of the fifth liner layer 112e.

From the above descriptions, a portion of the liner layers which are formed on the inner sidewall surfaces of the fin structures are higher than another portion of the liner layers which are formed on the outer sidewall surfaces of the fin structures. When the distance of the two adjacent fin structures is decreased, the height of the liner layers which are on the inner sidewall surfaces of the fin structures is increased.

For example, the first pitch $P_1$ between the first fin structure 110a and the second fin structure 110b is smaller than the second pitch $P_2$ between the third fin structure 110c and the fourth fin structure 110d. The second liner layer 112b between the first fin structure 110a and the second fin structure 110b is higher than the fourth liner layer 112d between the third fin structure 110c and the fourth fin structure 110d.

It should be noted that if the heights of inner liner layers are equal to or smaller than that of the outer liner layers, the fin structures will be bent due to the uneven stress. In order to avoid fin bending, the heights of the inner liner layers are controlled to be higher than that of the outer liner layers.

The height difference between the inner liner layers and the outer liner layers are controlled by using an etching process. In some embodiments, the etching process 15 includes a dry etching process. The dry etching process includes multiple etching steps (or operations). In some embodiments, the etching gases include hydrogen fluoride (HF) gas, ammonia ($NH_3$) gas, and dilute gas (such as $N_2$ or Ar). The etching rate of the liner layer 112 and the etching rate of the isolation layer 114 are controlled by adjusting the ratio of the flow rate of the etching gas. In some embodiments, the ratio of the flow rate of HF to the flow rate of $NH_3$ is in a range from about 1:2 to about 1:20. If the ratio is not within the above range, the inner liner layer will not be higher than the outer liner layer. As a result, the bending problem of the fin structures 110a, 110b, 110c and 110d may be serious and the performance of the FinFET device structure may be degraded.

As shown in FIG. 1H, a first spacing $S_1$ is between the top portion of the first fin structure 110a and the top portion of the second fin structure 110b. A second spacing S2 is between the interface of the first fin structure 110a and the interface of the second fin structure 110b. Since the bending problems of the first fin structure 110a and the second fin structure 110b are resolved by using inner liner layer higher than the outer liner layer, the first spacing $S_1$ is substantially equal to the second spacing $S_2$.

The liner layer 112 and the isolation layer 114 are simultaneously removed by the etching process 15. During the etching process 15, the isolation layer 114 (e.g. oxide layer) are mainly removed by the ammonia ($NH_3$) gas, and the liner layer 112 (e.g. silicon nitride) are mainly removed by the hydrogen fluoride (HF) gas. In order to decrease the amount of the liner layer 112 that is removed between the first fin structure 110a and the second fin structure 110b, the flow rate of ammonia ($NH_3$) gas is controlled to be higher than that of hydrogen fluoride (HF) gas. More specifically, when the pitch between the two adjacent fin structures is decreased, the area ratio of the second liner layer 112b with respect to the second isolation structure 114b is relatively higher than that of first liner layer 112a with respect to the first isolation structure 114a. That is, the area ratio of the inner liner layer with respect to the inner isolation layer is higher than the area ratio of the outer liner layer with respect to the outer isolation layer. By increasing the flow rate of ammonia ($NH_3$) gas (or decreasing the flow rate of hydrogen fluoride (HF) gas) in the etching process 15, the amount of the inner liner layer that is removed is less than that of the outer liner layer. As a result, the top surface of the inner liner layer is higher than the top surface of the outer liner layer.

For example, by increasing the flow rate of ammonia ($NH_3$) gas (or decreasing the flow rate of hydrogen fluoride (HF) gas) in the etching process 15, the amount of the second liner layer 112b that is removed is less than that of the first liner layer 112a. Therefore, the height of the second liner layer 112b is greater than the height of the first liner layer 112a. In other words, the top surface of the first liner structure 112a is lower than the top surface of the second liner layer 112b.

In some embodiments, the etching process 15 is operated at a pressure in a range from about 1 torr to about 5 torr. In some embodiments, the etching process 15 is operated at a temperature in a range from about 100 degrees to about 150 degrees. When the pressure and the temperature of the etching process 15 are kept within the range mentioned above, the etching efficiency of the etching process is improved. Furthermore, when the temperature of the etching process 15 is kept within the range mentioned above, the fin structure 110 is not oxidized or damaged.

Furthermore, in the region between the first fin structure 110a and the second fin structure 110b, the top surface of the second isolation structure 114b is lower than the top surface of the second liner layer 112a because the second isolation structure 114b is mainly removed by large amount of ammonia ($NH_3$) gas. More specifically, the top surface of the first liner layer 112a is higher than the top surface of the first isolation structure 114a, and the top surface of the second liner layer 112b is higher than the top surface of the second isolation structure 114b. Similarly, the top surface of the third liner layer 112c is higher than the top surface of the third isolation structure 114c. The top surface of the fourth liner layer 112d is higher than the top surface of the fourth isolation structure 114d.

As shown in FIG. 1H, each of the isolation structures 114a, 114b, 114c, 114d and 114e has a concave top surface. In the first region 11, the lowest point of the concave top surface of the second isolation structure 114b is higher than the lowest point of the concave top surface of the first isolation structure 114a. In the second region 12, a lowest point of the concave top surface of the fourth isolation structure 114d is higher than a lowest point of the concave top surface of the third isolation structure 114c. Furthermore, the lowest point of the concave top surface of the second isolation structure 114b is higher than the lowest point of the concave top surface of the fourth isolation structure 114d.

It should be noted that the etching gas in the etching process 15 is not excited in a plasma state. In other words, in the etching process 15, plasma is not turned on. If the etching gas is operated at the plasma state, the fin structures 110a, 110b, 110c and 110d may be damaged. Therefore, the profile and shape of the fin structures 110a, 110b, 110c and 110d may be destroyed.

Furthermore, the etching process 15 includes a number of etching steps and a cleaning step is between two etching steps. In some embodiments, a first etching step is performed for a period of time in a range from about 1 second to about 30 seconds, a cleaning step is performed after the first etching step for a period of time in a range from about 60 second to about 300 seconds, and a second etching step is performed after the cleaning step. Note that during the cleaning step, the etching gas is stopped. The cleaning step is used to remove the unwanted residues and byproducts generated from the etching steps. The etching efficiency of the etching process 15 is improved. The cleaning step is performed in-situ without transferred to another chamber. Therefore, pollution is avoided and throughput is improved.

Figure 1I:
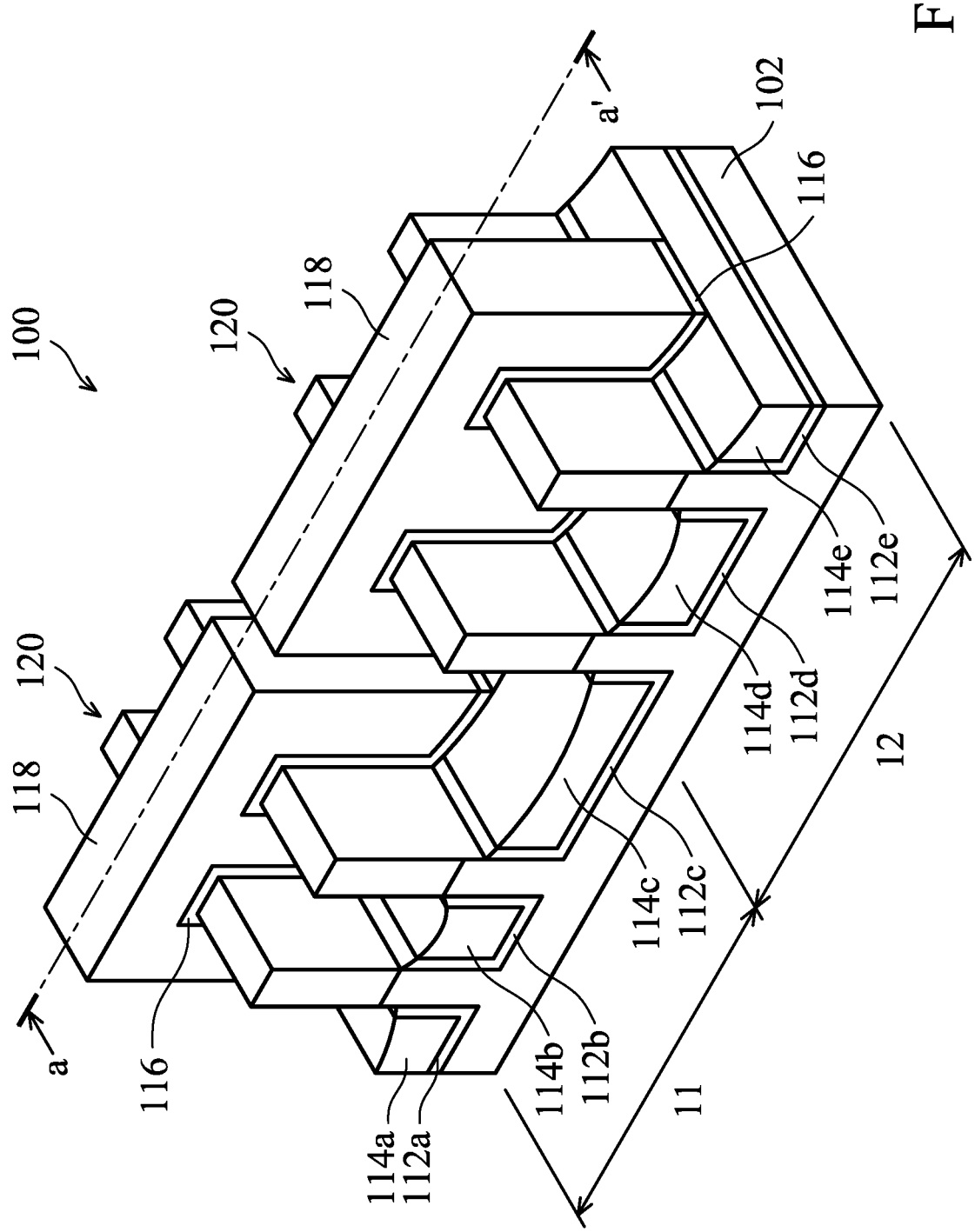

Next, as shown in FIG. 1I, a gate dielectric layer 116 is formed on the fin structures 110a, 110b, 110c and 110d, the isolation structures 114a, 114b, 114c, 114d and 114e and a gate electrode layer 118 is formed on the gate dielectric layer 116, in accordance with some embodiments. A gate structure 120 is constructed by the gate dielectric layer 116 and the gate electrode layer 118. In some embodiments, the gate dielectric layer 116 is a dummy gate dielectric layer and the gate electrode layer 118 is a dummy gate electrode layer. The dummy gate dielectric layer and the dummy gate electrode layer may be replaced by the following steps to form a real gate structure with a high-k dielectric layer and a metal gate electrode layer.

The gate dielectric layer 116 includes a first portion and a second portion, the first portion is directly over the first liner layer 112a and the second portion is directly over the second liner layer 112b. Due to the height difference between the first liner layer 112a and the second liner layer 112b, the bottom surface of the second portion of the gate dielectric layer 116 is higher than the bottom surface of the first portion of the gate dielectric layer 116.

In some embodiments, the gate dielectric layer 116 may include dielectric materials, such as silicon oxide, silicon nitride, silicon oxynitride, dielectric material(s) with high dielectric constant (high-k), or combinations thereof. In some embodiments, the gate electrode layer 118 is made of polysilicon. The gate dielectric layer 116 and the gate electrode layer 118 are independently formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Afterwards, a pair of spacer layers (not shown) are formed on opposite sidewalls of the gate structure 120, in accordance with some embodiments. More specifically, the spacer layers 120 are formed on sidewall surfaces of the gate electrode layer 118. The spacer layers may be made of silicon oxide, silicon nitride, silicon oxynitride, and/or dielectric materials. In some embodiments, the spacer layers are formed by a chemical vapor deposition (CVD) process, a spin-on-glass process, or another applicable process.

Afterwards, a top portion of the fin structures 110a, 110b, 110c, and 110d is removed to form a recess (not shown), and the source/drain (S/D) structures (not shown) are formed in the recess. The source/drain (S/D) structures are formed on opposite sidewall surfaces of the gate structure 120.

Afterwards, an inter-layer dielectric (ILD) material is formed over the fin structures 110a, 110b, 110c and 110d, and over the gate structure 120. Next, the ILD material is planarized to form the ILD structure.

Next, the dummy gate dielectric layer 116 and the dummy gate electrode layer 118 are removed to form a trench, and the real gate dielectric layer and metal gate electrode layer (not shown) are filled into the trench. In some embodiments, a work function layer (not shown) may be formed between the gate dielectric layer and the gate electrode layer. Afterwards, the FinFET device structure 100 continues to form other devices or structures.

FIGS. 2A-2I show cross-sectional representations of various stages of forming the FinFET device structure 100 shown in FIGS. 1A-1I. FIGS. 2A-2I show cross-sectional representations taken along line aa' in FIGS. 1A-1I. Some processes and materials used to form the FinFET device structure in FIGS. 1A-1I are similar to, or the same as, those used to form the FinFET structure 100 in FIGS. 2A-2I and are not repeated herein.

Figure 2A:
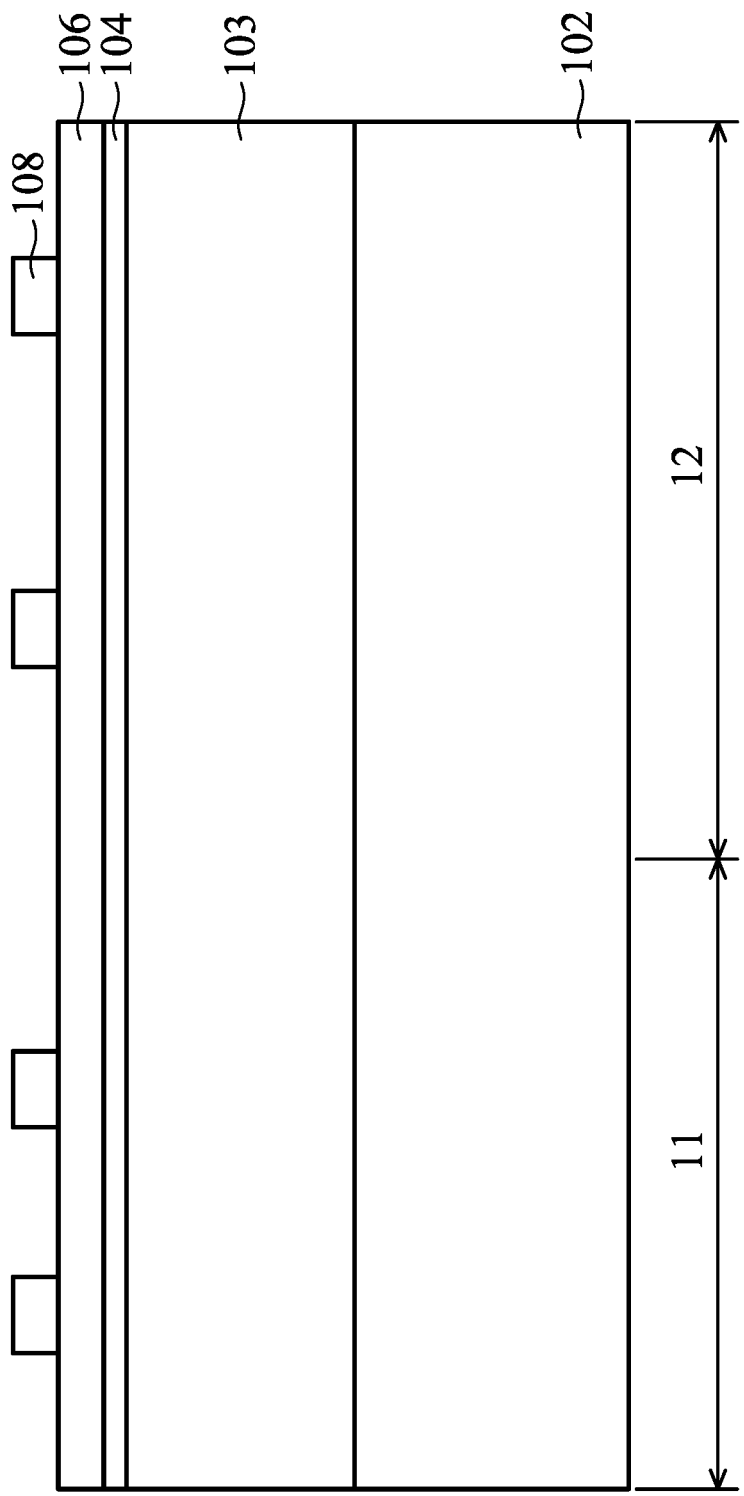
FIGS. 2A-2I show cross-sectional representations of various stages of forming the FinFET device structure shown in FIGS. 1A-1I.

As shown in FIG. 2A, the substrate 102 includes the first region 11 and the second region 12. The material layer 103 is formed over the substrate 102, and the dielectric layer 104 and the mask layer 106 are sequentially formed on the material layer 103. Afterwards, the photoresist layer 108 is formed over the mask layer 106 and it is patterned to form a patterned photoresist layer 108.

Figure 2B:
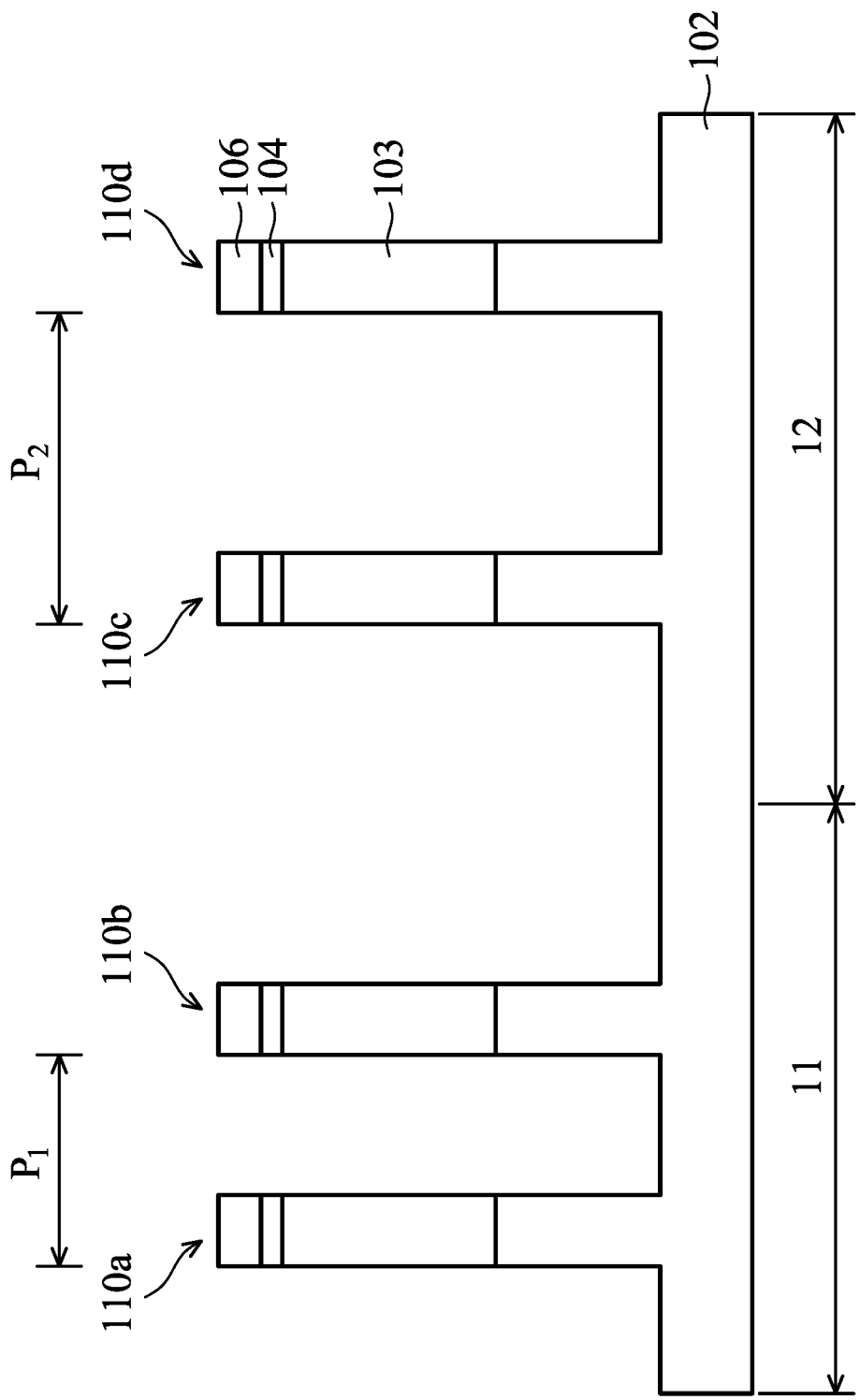

Next, as shown in FIG. 2B, the dielectric layer 104 and the mask layer 106 are patterned by using the patterned photoresist layer 108 as a mask, in accordance with some embodiments. Afterwards, the material layer 103 and the substrate 102 are patterned to form a number of fin structures 110a, 110b, 110c and 110d. In the first region 11, the first pitch $P_1$ is between a sidewall surface of the first fin structure 110a and a sidewall surface of the second fin structure 110b. The second pitch $P_2$ is between a sidewall surface of the third fin structure 110c and a sidewall surface of the fourth fin structure 110d. In some embodiments, the second pitch $P_2$ is greater than the first pitch $P_1$.

Figure 2C:
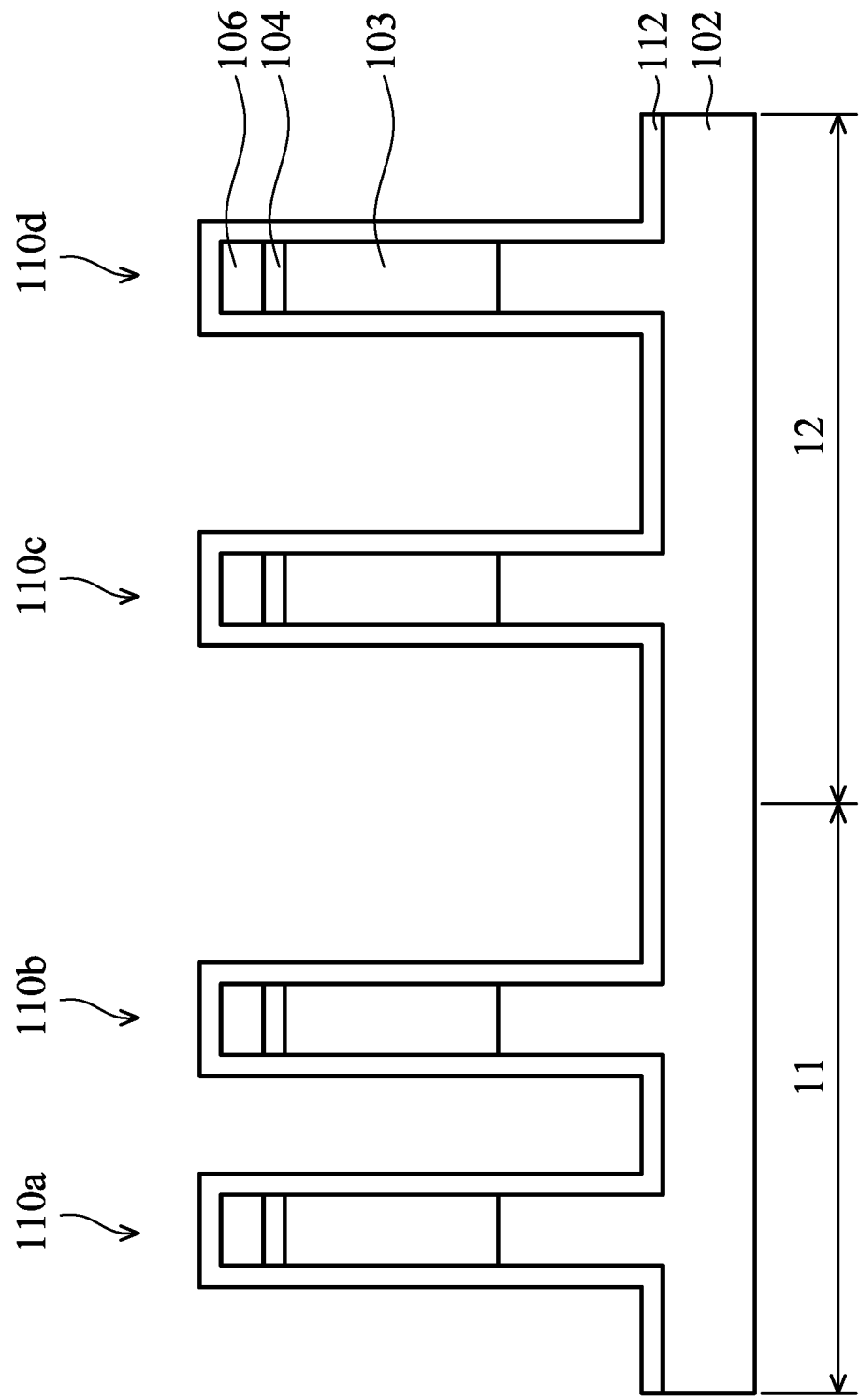

Afterwards, as shown in FIG. 2C, the liner layer 112 is formed on the fin structures 110a, 110b, 110c and 110d. More specifically, the liner layer 112 is conformally formed on the sidewall surfaces and the top surface of the fin structures 110a, 110b, 110c and 110d, and on the mask layer 106, in accordance with some embodiments. The liner layer 112 is used to protect the fin structures 110a, 110b, 110c and 110d from being damaged by the following processes (such as an anneal process or an etching process). In some embodiments, the liner layer 112 is made of silicon nitride (SixNy).

Figure 2D:
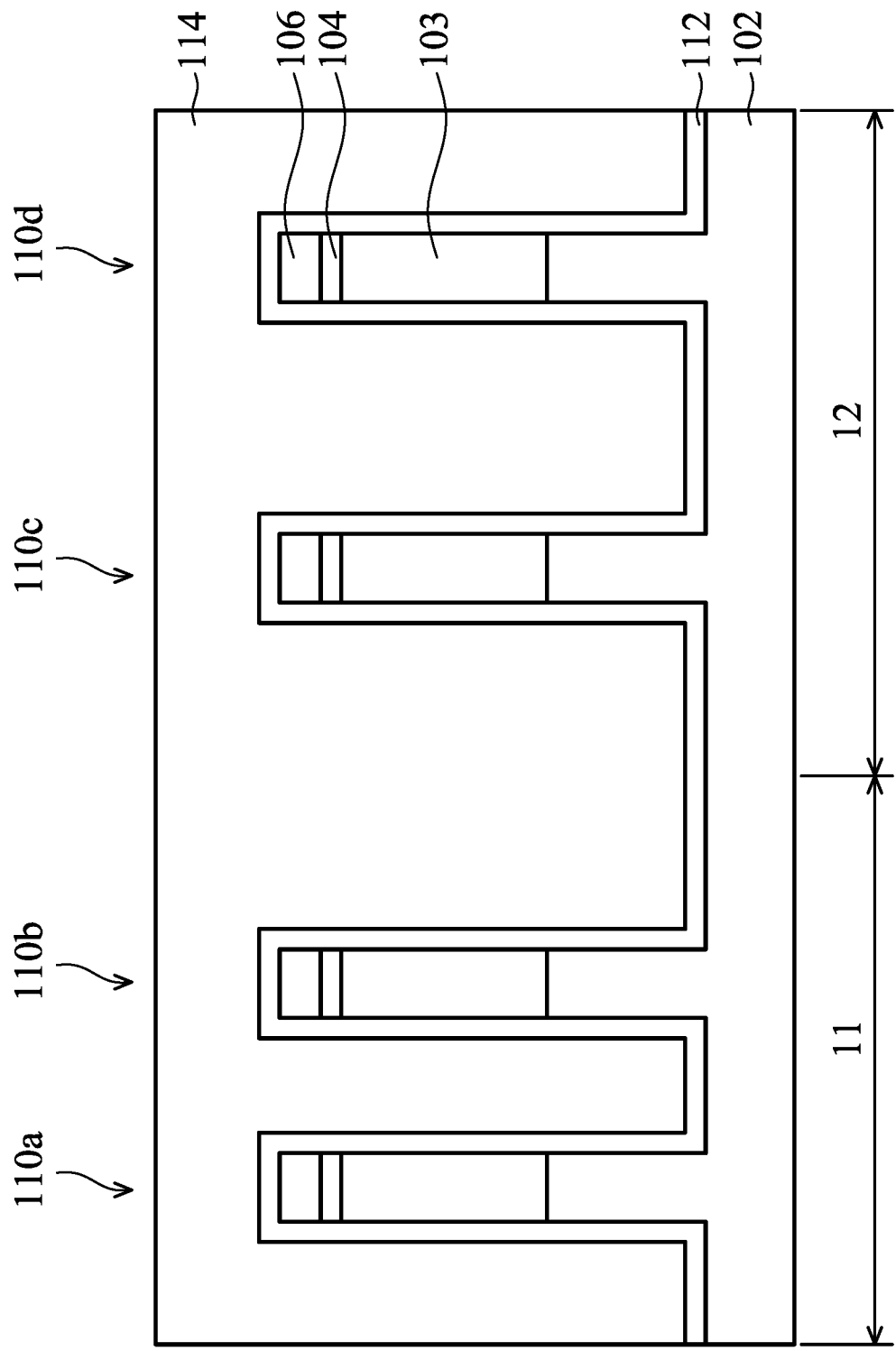

Next, as shown in FIG. 2D, the isolation layer 114 is formed to cover the fin structures 110a, 110b, 110c and 110d over the substrate 102, in accordance with some embodiments.

Figure 2E:
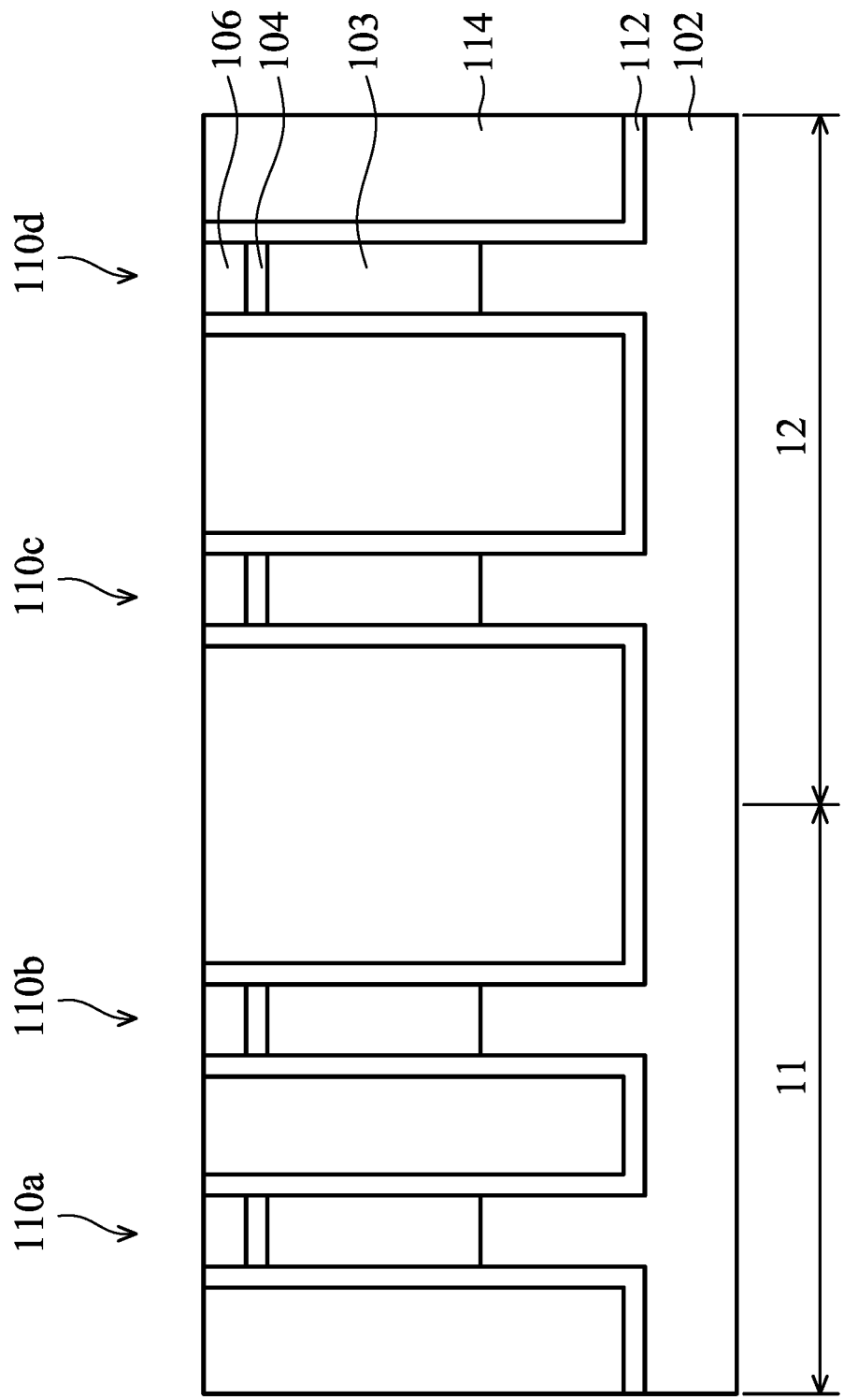

Afterwards, as shown in FIG. 2E, the isolation layer 114 is thinned or planarized to expose the top surface of the patterned mask layer 106, in accordance with some embodiments. In some embodiments, the isolation layer 114 is thinned by a chemical mechanical polishing (CMP) process.

Figure 2F:
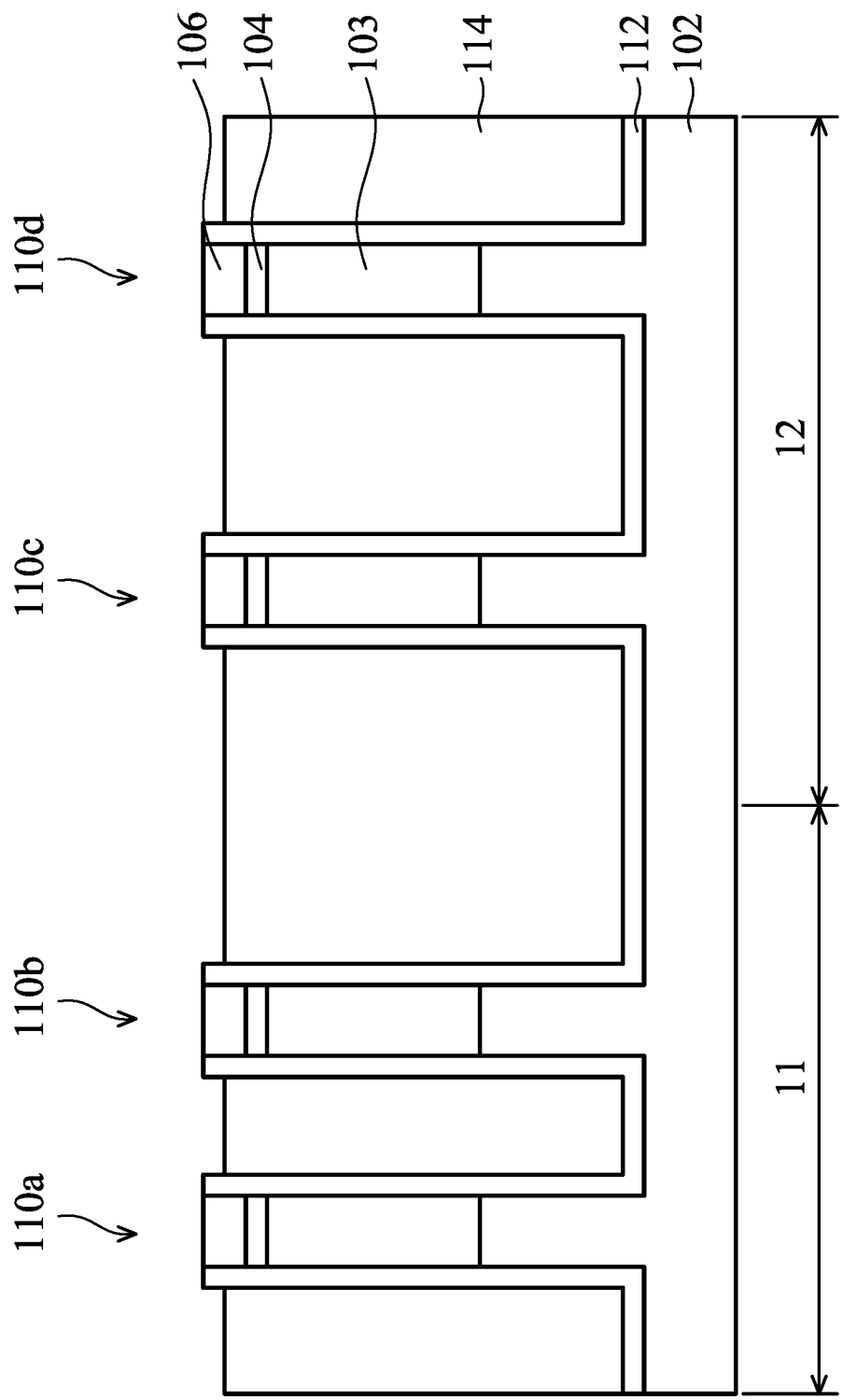

Afterwards, as shown in FIG. 2F, a portion of the isolation layer 114 is removed, in accordance with some embodiments. As a result, a top surface of the patterned mask layer 106 is exposed, and a portion of the liner layer 112 is exposed.

Figure 2G:
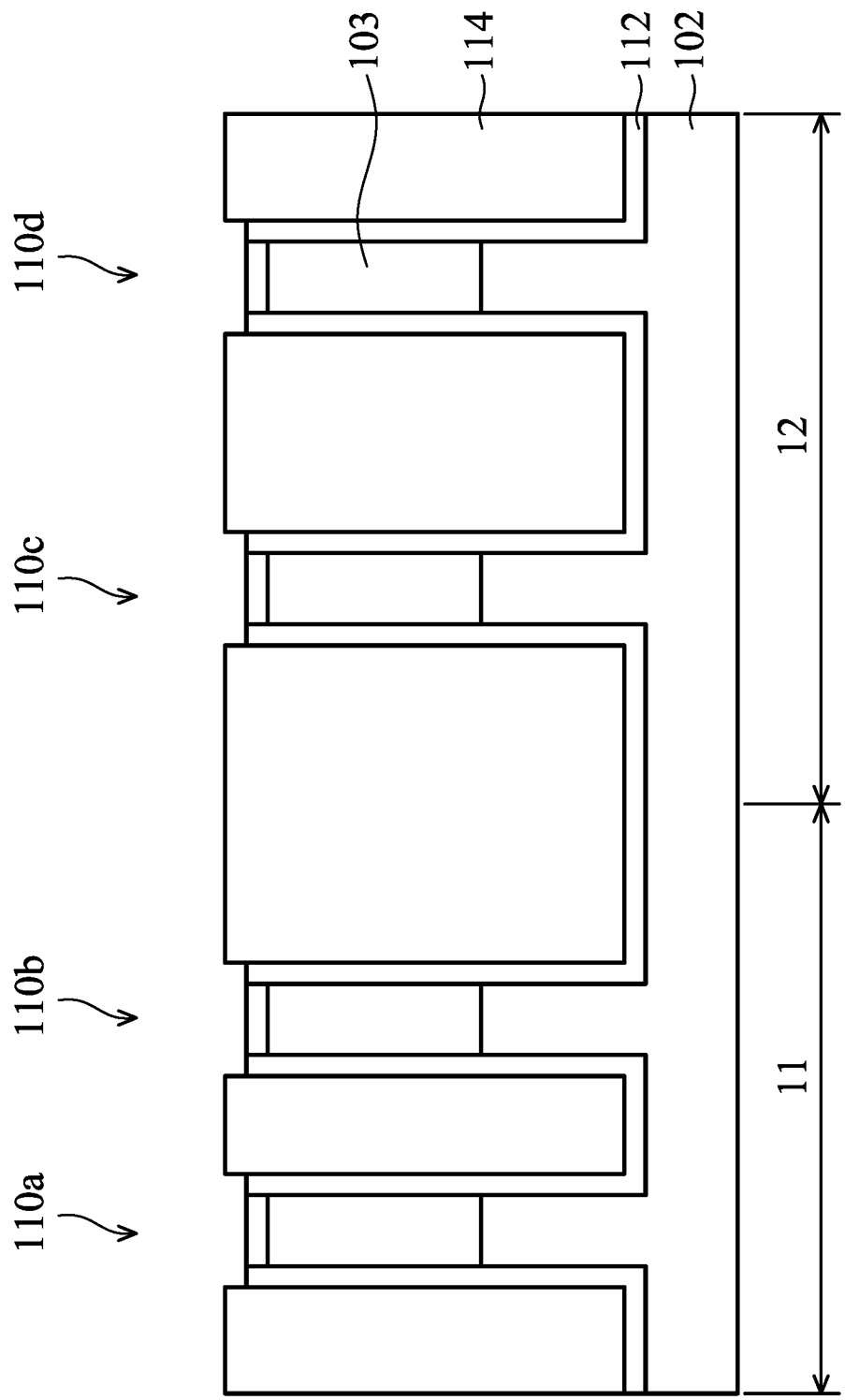

Next, as shown in FIG. 2G, the patterned mask layer 106 is removed, in accordance with some embodiments. In some embodiments, the patterned mask layer 106 is removed by a wet etching process.

Figure 2H:
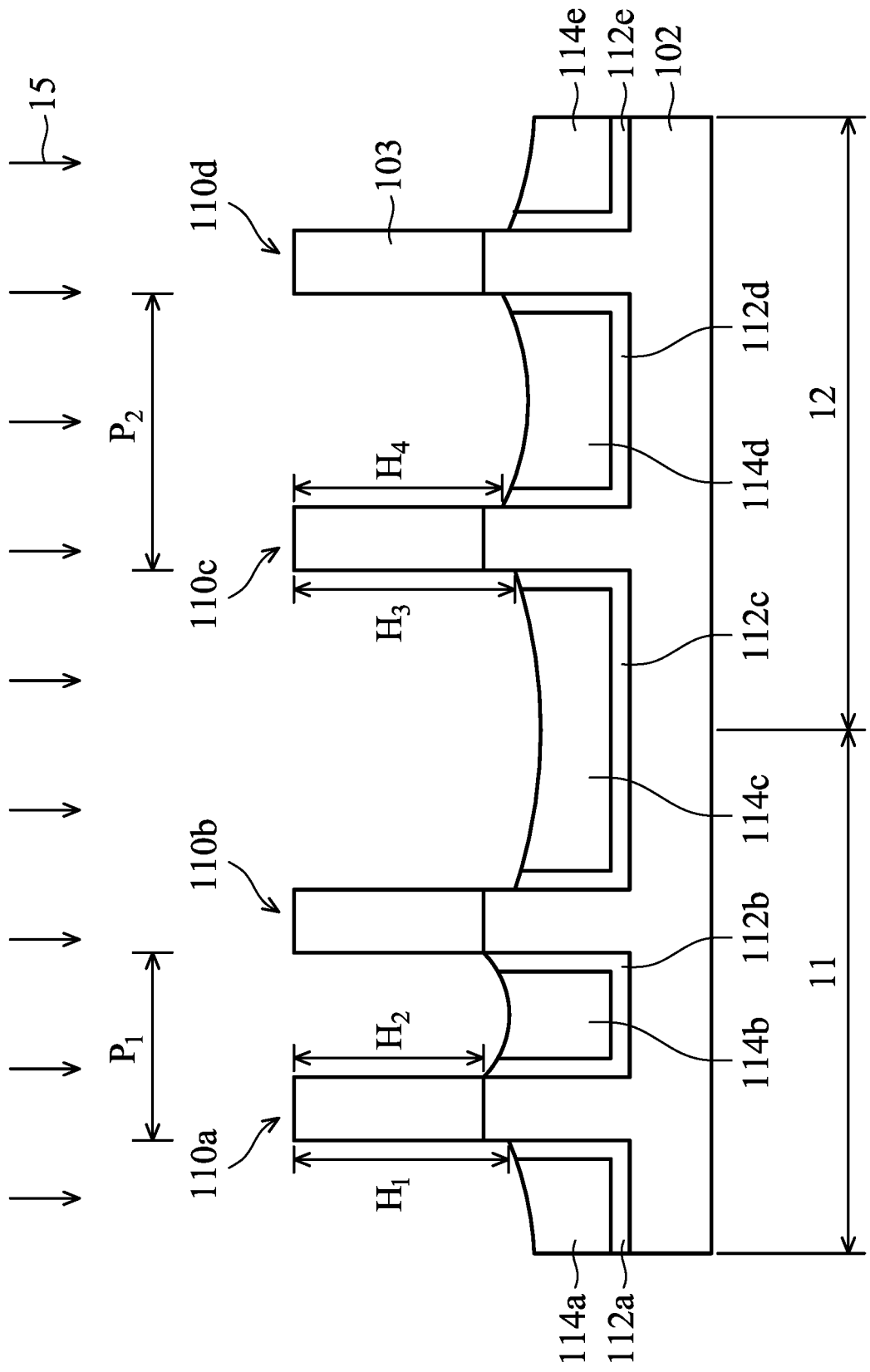

Afterwards, as shown in FIG. 2H, an etching process 15 is performed on the patterned dielectric layer 104 and the liner layer 112, in accordance with some embodiments. The etching process 15 is used to remove the patterned dielectric layer 104, a portion of the liner layer 112 and a portion of the isolation layer 114. As a result, the first liner layer 112a, the second liner layer 112b, the third liner layer 112c, the fourth liner layer 112d and the fifth liner layer 112e are obtained. In addition, the first isolation structure 114a, the second isolation structure 114b, the third isolation structure 114c, the fourth isolation structure 114d and the fifth isolation structure 114e are obtained.

In the first region 11, the first fin structure 110a has the inner sidewall surface and the outer sidewall surface, the inner sidewall surface is close to the second fin structure 110b and the outer sidewall surface is far away from the second fin structure 110b. The outer fin height of the first fin structure 110a is defined as $H_1$ which is measured from a top surface of the first liner layer 112a to a top surface of the first fin structure 110a. The inner fin height of the first fin structure 110a is defined as $H_2$ which is measured from a top surface of the second liner layer 112b to the top surface of the first fin structure 110a. The inner fin height $H_2$ is smaller than the outer fin height $H_1$. In some embodiments, the height difference ($\Delta H=H_1-H_2$) between the top surface of the first liner layer 112a and the top surface of the second liner layer 112b is in a range from about 0.1 nm to about 2 nm. In some embodiments, the outer fin height $H_1$ of the first fin structure 110a is in a range from about 45 nm to about 60 nm. In some embodiments, the inner fin height $H_2$ of the first fin structure 110a is in a range from about 43 nm to about 58 nm.

In the second region 12, the third fin structure 110c has the inner sidewall surface and the outer sidewall surface, the inner sidewall surface is close to the fourth fin structure 110d and the outer sidewall surface is far away from the fourth fin structure 110d. The outer fin height of the third fin structure 110c is defined as $H_3$ which is measured from a top surface of the third liner layer 112c to a top surface of the third fin structure 110c. The inner fin height of the third fin structure 110c is defined as $H_4$ which is measured from a top surface of the fourth liner layer 112d to the top surface of the third fin structure 110c. The inner fin height $H_4$ is smaller than the outer fin height $H_3$. In addition, the inner fin height $H_2$ of the first fin structure 110a is smaller than the inner fin height $H_4$ of the third fin structure 110c. In some embodiments, the height difference ($\Delta H=H_3-H_4$) between the top surface of the third liner layer 112c and the top surface of the fourth liner layer 112d is in a range from about 0.1 nm to about 2 nm. In some embodiments, the outer fin height $H_3$ of the third fin structure 110c is in a range from about 47 nm to about 62 nm. In some embodiments, the inner fin height $H_4$ of the third fin structure 110c is in a range from about 45 nm to about 60 nm.

As shown in FIG. 2H, the top surface of the second isolation structure 114b is higher than the top surface of the first isolation structure 114a. In addition, the top surface of the second isolation structure 114b is higher than the top surface of the fourth isolation structure 114d.

Due to the protection of the higher inner second liner layer 112b, the first fin structure 110a and the second fin structure 110b are not bent after the etching process 15. Similarly, the third fin structure 110c and the fourth fin structure 110d are not bent after the etching process 15 due to the higher inner fourth liner layer 112d.

Figure 2I:
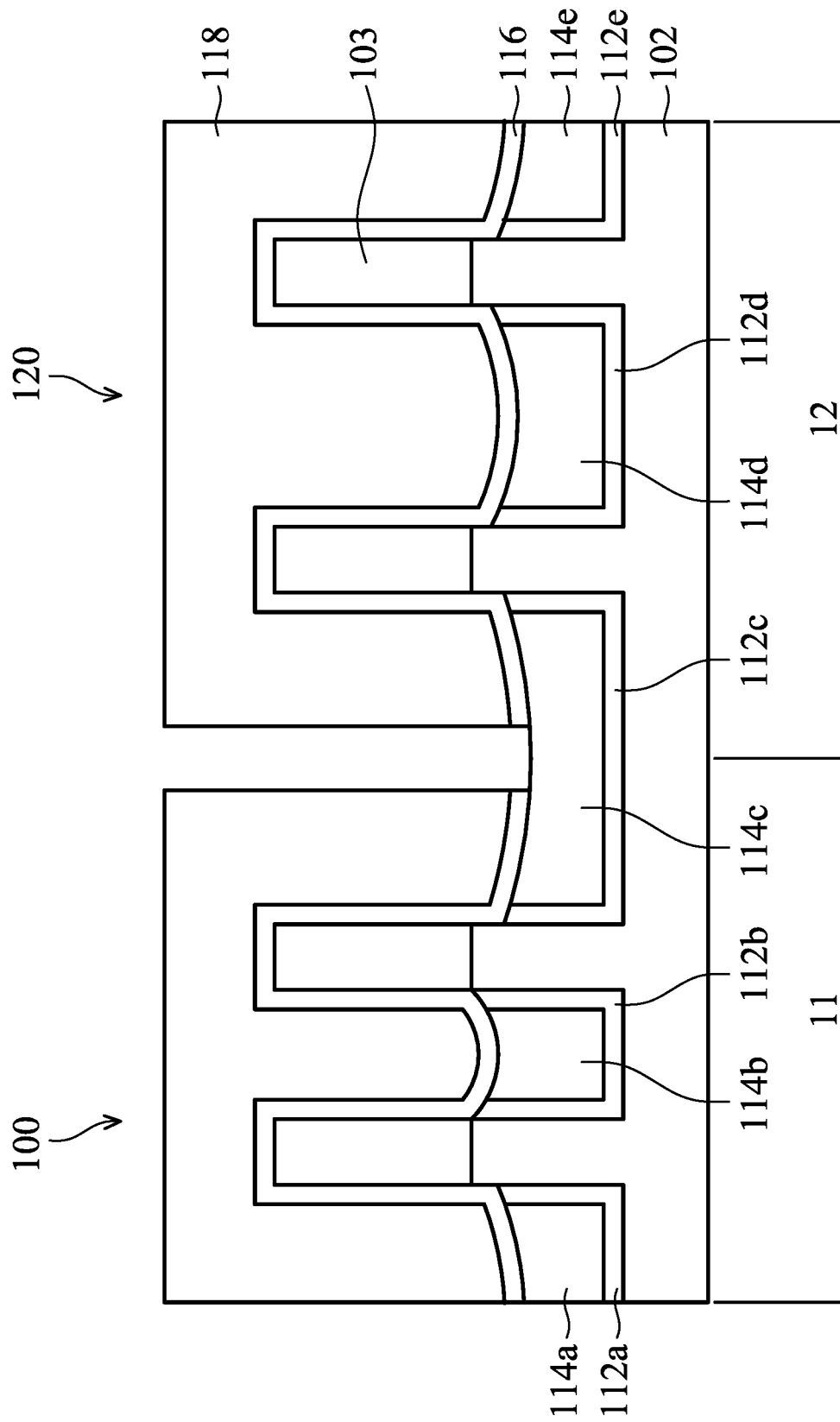

Next, as shown in FIG. 2I, the gate dielectric layer 116 is formed on the fin structures 110a, 110b, 110c and 110d, the isolation structures 114a, 114b, 114c, 114d and 114e and the gate electrode layer 118 is formed on the gate dielectric layer 116, in accordance with some embodiments. Afterwards, the FinFET device structure 100 continues to form other devices or structures.

It should be noted that fin bending problem is prevented due to formation of the inner liner layer higher than the outer liner layer. The fin profile and fin shape are maintained because the liner layer 112 is formed on the sidewall surfaces of the fin structures 110a, 110b, 110c and 110d. The heights of the liner layers 112a, 112b, 112c, 112d and 112e are controlled by using the etching process 15 with different etching rate for removing the liner layer 112 and the isolation layer 114.

Embodiments for forming a FinFET device structure and method for formation of the same are provided. The FinFET device structure includes a first fin structure and a second fin structure extending above a substrate. The first liner layer is formed on an outer sidewall surface of the first fin structure, and the second liner layer is formed on an inner sidewall surface of the first fin structure. A top surface of the second liner layer is higher than a top surface of the first liner layer. The inner liner layer is higher than the outer liner layer to prevent the fin bending problems. Therefore, the performance of the FinFET device structures is improved.

In some embodiments, a fin field effect transistor (FinFET) device structure is provided. The FinFET device structure includes a first fin structure extending above a substrate, and the first fin structure includes a bottom portion and a top portion, and the top portion is made of silicon germanium (SiGe). The FinFET device structure includes a second fin structure adjacent to the first fin structure, and the first fin structure includes an inner sidewall surface close to the second fin structure and an outer sidewall surface away from the second fin structure. The FinFET device structure also includes a first liner layer formed on the outer sidewall surface of the first fin structure and a second liner layer formed on the inner sidewall surface of the first fin structure. The FinFET device structure further includes a first isolation structure formed on the substrate, and the first liner layer is between the first isolation structure and the first fin structure, and a top surface of the second liner layer is higher than a top surface of the first liner layer.

In some embodiments, a FinFET device structure is provided. The FinFET device structure includes a substrate, and the substrate includes a first region and a second region. The FinFET device structure includes a first fin structure and a second fin structure extending above the first region of the substrate, and the first fin structure includes a bottom portion and a top portion, the top portion is made of silicon germanium (SiGe), a first pitch between the first fin structure and the second fin structure. The FinFET device structure further includes a third fin structure and a fourth fin structure extending above the second region of the substrate. The third fin structure is between the second fin structure and the fourth fin structure, and a second pitch is between the third fin structure and the fourth fin structure, and the second pitch is greater than the first pitch. The FinFET device structure also includes a first liner layer formed on an inner sidewall surface of the first fin structure and an inner sidewall surface of the second fin structure and a second liner layer formed on an outer sidewall surface of the second fin structure and an outer sidewall surface of the third fin structure. A top surface of the first liner layer is higher than a top surface of the second liner layer.

In some embodiments, a method for forming a FinFET device structure is provided. The method includes forming a first fin structure and a second fin structure over a substrate and forming a liner layer over the first fin structure and the second fin structure. The method also includes forming an isolation layer over the liner layer and removing a portion of the liner layer and a portion of the isolation layer, such that the liner layer includes a first liner layer on an outer sidewall surface of the first fin structure and a second liner layer on an inner sidewall surface of the first fin structure, and a top surface of the second liner layer is higher than a top surface of the first liner layer.

In some embodiments, a method for forming a FinFET device structure is provided. The method include forming a first fin structure and a second fin structure over a substrate, and the first fin structure has a first bottom portion and a first top portion, and a first interface is between the first bottom portion and the first top portion, and the second fin structure has a second bottom portion and a second top portion, and a second interface is between the second bottom portion and the second top portion. The method also includes forming a liner layer over the first fin structure and the second fin structure, and forming an isolation layer over the liner layer. The method further includes removing a first portion of the isolation layer to expose a portion of the liner layer. The method includes removing a first portion of the liner layer, such that a top surface of the liner layer is lower than a top surface of the isolation layer. The method includes simultaneously removing a second portion of the isolation layer and a second portion of the liner layer to form an isolation structure between the first fin structure and the second fin structure, wherein the liner layer comprises a first liner layer on an inner sidewall of the first fin structure and a second liner layer on an outer sidewall of the second fin structure. The first liner layer is in direct contact with the first interface, and the second liner layer is lower than a top surface of the second interface.

In some embodiments, a method for forming a FinFET device structure is provided. The method includes forming a first fin structure and a second fin structure over a first region of a substrate, wherein the first fin structure has a first bottom portion and a first top portion, and a first interface is between the first bottom portion and the first top portion. The method also includes forming a third fin structure and a fourth fin structure over a second region of the substrate, wherein the third fin structure has a third bottom portion and a third top portion, and a third interface is between the third bottom portion and the third top portion. The method includes forming a liner layer over the first fin structure, the second fin structure, the third fin structure and the fourth fin structure. The method includes forming an isolation layer over the liner layer, and removing a portion of the isolation layer and a portion of the liner layer to form a first isolation structure between the first fin structure and the second fin structure, a second isolation structure between the second fin structure and the third fin structure. A bottommost point of the first isolation structure is higher than a bottommost point of the second isolation structure and lower than the first interface.

In some embodiments, a FinFET device structure is provided. The FinFET device structure includes a first fin structure extending above a substrate, and the first fin structure has a bottom portion and a top portion, the bottom portion and the top portion of the first fin structure are made of different materials, a first interface is between the top portion and the bottom portion. The FinFET device structure includes a first liner layer formed on a first sidewall surface of the first fin structure, and a gate dielectric layer formed over the first fin structure and the first liner layer. A second interface between the first liner layer and the gate dielectric layer, and the second interface is in direct contact with the first interface.

In some embodiments, a FinFET device structure is provided. The FinFET device structure includes a first fin structure extending above a substrate, and a second fin structure adjacent to the first fin structure. The first fin structure includes an inner sidewall surface close to the second fin structure and an outer sidewall surface away from the second fin structure. The first liner layer formed on the inner sidewall surface of the first fin structure, and a second liner layer formed on the outer sidewall surface of the first fin structure. The top surface of the first liner layer is higher than a top surface of the second liner layer.

In some embodiments, a FinFET device structure is provided. The FinFET device structure includes a first fin structure formed over a substrate, and a first liner layer over a bottom portion of the first fin structure. The FinFET device structure includes a gate dielectric layer over the first liner layer and the first fin structure. The first interface between the first liner layer and the gate dielectric layer, and the first interface is sloped.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
    a first fin structure extending above an isolation structure over a substrate, wherein the first fin structure has a bottom portion and a top portion, the bottom portion and the top portion of the first fin structure are made of different materials, a first interface is between the top portion and the bottom portion;
    a first liner layer formed on a first sidewall surface of the first fin structure, wherein the first liner layer has an outer surface in contact with the first fin structure and an inner surface in contact with the isolation structure; and
    a gate dielectric layer formed over the first fin structure and the first liner layer, wherein a second interface between the first liner layer and the gate dielectric layer, and the second interface is in direct contact with the first interface, wherein a sidewall surface of the gate dielectric layer is aligned with the inner surface of the first liner layer.

2. The fin field effect transistor (FinFET) device structure as claimed in claim 1, wherein a portion of the gate dielectric layer is lower than the first interface.

3. The fin field effect transistor (FinFET) device structure as claimed in claim 1, further comprising:
    a second liner layer formed on a second sidewall surface of the first fin structure, wherein a third interface between the second liner layer and the gate dielectric layer, and the third interface is lower than the second interface.

4. The fin field effect transistor (FinFET) device structure as claimed in claim 1, wherein a topmost surface of the first liner layer is higher than a topmost surface of the isolation structure.

5. The fin field effect transistor (FinFET) device structure as claimed in claim 1, wherein the gate dielectric layer has a curved bottom surface.

6. The fin field effect transistor (FinFET) device structure as claimed in claim 1, further comprising:
    a gate electrode formed over the gate dielectric layer, wherein the gate electrode has a curved bottom surface.

7. A fin field effect transistor (FinFET) device structure, comprising:
    a first fin structure extending above a substrate;
    a second fin structure adjacent to the first fin structure, wherein the first fin structure comprises an inner sidewall surface close to the second fin structure and an outer sidewall surface away from the second fin structure;
    a first liner layer formed on the inner sidewall surface of the first fin structure;
    a second liner layer formed on the outer sidewall surface of the first fin structure, wherein a top surface of the first liner layer is higher than a top surface of the second liner layer;
    a third fin structure formed adjacent to the second fin structure;
    a first gate electrode formed over the first fin structure and the second fin structure;
    a second gate electrode formed over the third fin structure, wherein the first gate electrode is separated from the second gate electrode; and
    a first gate dielectric layer between the first gate electrode and the first fin structure, wherein a sidewall surface of the first gate dielectric layer is aligned with a sidewall surface of the first liner layer.

8. The fin field effect transistor (FinFET) device structure as claimed in claim 7, wherein the first fin structure has a bottom portion and a top portion, the bottom portion and the top portion of the first fin structure are made of different materials, a first interface is between the top portion and the bottom portion, and the first interface is higher than the top surface of the second liner layer.

9. The fin field effect transistor (FinFET) device structure as claimed in claim 7, wherein the first liner layer extends from the inner sidewall surface of the first fin structure to an inner sidewall surface of the second fin structure.

10. The fin field effect transistor (FinFET) device structure as claimed in claim 7, further comprising:
    a first isolation structure between the first fin structure and the second fin structure, wherein a topmost surface of the first liner layer is higher than a topmost surface of the first isolation structure.

11. The fin field effect transistor (FinFET) device structure as claimed in claim 10, wherein the first isolation structure has a curved top surface.

12. The fin field effect transistor (FinFET) device structure as claimed in claim 7, wherein a first distance between the top surface of the first liner layer to a top surface of the first fin structure, a second distance between the top surface of the second liner layer to the top surface of the first fin structure, and the first distance is smaller than the second distance.

13. The fin field effect transistor (FinFET) device structure as claimed in claim 7, further comprising:
    a third liner layer formed on a sidewall of the third fin structure, wherein a top surface of the third liner layer is lower than the top surface of the first liner layer.

14. The fin field effect transistor (FinFET) device structure as claimed in claim 13, further comprising:
    a second isolation structure between the second fin structure and the third fin structure, wherein a topmost surface of the second isolation structure is lower than the top surface of the first liner layer.

15. The fin field effect transistor (FinFET) device structure as claimed in claim 7,
    wherein the first gate dielectric layer comprises a first portion and a second portion, the first portion is directly over the first liner layer, the second portion is directly over the second liner layer, a bottom surface of the first portion is higher than a bottom surface of the second portion.

16. The fin field effect transistor (FinFET) device structure as claimed in claim 15, wherein the first gate dielectric layer has a curved bottom surface.

17. The fin field effect transistor (FinFET) device structure as claimed in claim 7, wherein the first liner layer has a U-shaped structure.

18. A fin field effect transistor (FinFET) device structure, comprising:
- a first fin structure formed over a first region of a substrate;
- a second fin structure formed over a second region of the substrate;
- a first liner layer over a bottom portion of the first fin structure;
- a first gate dielectric layer over the first liner layer and the first fin structure, wherein a first interface between the first liner layer and the first gate dielectric layer, and the first interface is sloped; and
- a second gate dielectric layer formed over the second fin structure, wherein the first gate dielectric layer is separated from the second gate dielectric layer,
- wherein the first fin structure has a first bottom portion and a first top portion, the first bottom portion and the first top portion are made of different materials, a second interface is between the first bottom portion and the first top portion, and the second interface is in direct contact with the first interface.

19. The fin field effect transistor (FinFET) device structure as claimed in claim 18, further comprising:
- an isolation structure adjacent to the first liner layer, wherein the isolation structure has a curved top surface.

20. The fin field effect transistor (FinFET) device structure as claimed in claim 18, further comprising:
- a first gate electrode formed over the first gate dielectric layer, wherein a portion of the first gate electrode is lower than the first interface.

* * * * *